United States Patent
Sakamoto et al.

(10) Patent No.: US 9,394,128 B2
(45) Date of Patent: Jul. 19, 2016

(54) TRANSFER METHOD, HOLDING APPARATUS, AND TRANSFER SYSTEM

(71) Applicant: HIRATA CORPORATION, Shinagawa-ku (JP)

(72) Inventors: Hideo Sakamoto, Shinagawa-ku (JP); Shuichi Komuro, Shinagawa-ku (JP)

(73) Assignee: HIRATA CORPORATION, Shinagawa-Ku, Tokyo (JP)

(*) Notice: Subject to any disclaimer, the term of this patent is extended or adjusted under 35 U.S.C. 154(b) by 0 days.

(21) Appl. No.: 14/571,448

(22) Filed: Dec. 16, 2014

(65) Prior Publication Data

US 2015/0197405 A1    Jul. 16, 2015

(30) Foreign Application Priority Data

Jan. 10, 2014  (JP) ................ 2014-003675

(51) Int. Cl.
| | |
|---|---|
| *H01L 21/00* | (2006.01) |
| *B65H 5/10* | (2006.01) |
| *B65H 5/14* | (2006.01) |
| *B65H 5/04* | (2006.01) |
| *H05K 13/00* | (2006.01) |

(52) U.S. Cl.
CPC .. *B65H 5/10* (2013.01); *B65H 5/04* (2013.01); *B65H 5/14* (2013.01); *H05K 13/0061* (2013.01); *H05K 13/0069* (2013.01); *B65H 2801/61* (2013.01); *B65H 2801/72* (2013.01)

(58) Field of Classification Search
CPC ......... H01L 21/00; H01L 21/67; H01L 21/68; H01L 21/673; H01L 21/683; H01L 21/67109; H01L 21/6831; H01L 21/68707; H01L 21/67051; H01L 21/687428

USPC ........... 438/16, 778, 782; 29/740; 156/345.53
See application file for complete search history.

(56) References Cited

U.S. PATENT DOCUMENTS

| | | | | |
|---|---|---|---|---|
| 5,893,795 | A * | 4/1999 | Perlov ...................... | B23Q 7/00 312/273 |
| 6,334,840 | B1 * | 1/2002 | Asai .................... | H05K 13/0408 29/740 |
| 7,306,551 | B2 * | 12/2007 | Hata .................... | B25J 15/0491 483/16 |
| 2001/0009178 | A1 * | 7/2001 | Tamura ............. | H01L 21/67109 156/345.53 |
| 2001/0049875 | A1 * | 12/2001 | Watanabe .......... | H05K 13/0069 29/832 |
| 2004/0253833 | A1 * | 12/2004 | Takehiko .......... | H01L 21/67051 438/778 |
| 2007/0159615 | A1 * | 7/2007 | Horiuchi ............... | G03F 7/7075 355/72 |

(Continued)

FOREIGN PATENT DOCUMENTS

JP    2010-272650 A    12/2010

*Primary Examiner* — Michael Lebentritt
(74) *Attorney, Agent, or Firm* — Buchanan Ingersoll & Rooney PC

(57) ABSTRACT

This invention provides a transfer method of transferring, from a carrier including a placing portion on which a substrate is placed, and a cover that is superposed on the upper surface of the placing portion in close contact, the substrate held between the placing portion and the cover. The transfer method includes a holding step of holding the substrate and the cover on the placing portion by a holding apparatus, and a moving step of moving the holding apparatus to move the substrate and the cover from the placing portion to a transfer destination. In the holding step, the cover is held by the cover holding unit of the holding apparatus, and the substrate is held by the substrate holding unit of the holding apparatus in parallel postures of the cover and substrate.

10 Claims, 18 Drawing Sheets

(56) References Cited

U.S. PATENT DOCUMENTS

| | | | |
|---|---|---|---|
| 2007/0195297 A1* | 8/2007 | Nakaharada | G03D 3/08 355/53 |
| 2010/0222919 A1* | 9/2010 | Kazuyuki | H01L 21/67712 700/228 |
| 2010/0297562 A1* | 11/2010 | Shibazaki | G03F 7/70691 430/325 |
| 2012/0128459 A1* | 5/2012 | Hoyer | B01L 9/523 414/783 |
| 2014/0004779 A1* | 1/2014 | Namiki | B24B 37/30 451/365 |
| 2015/0273657 A1* | 10/2015 | Fukushima | B24B 37/30 451/288 |

* cited by examiner

F I G. 8A
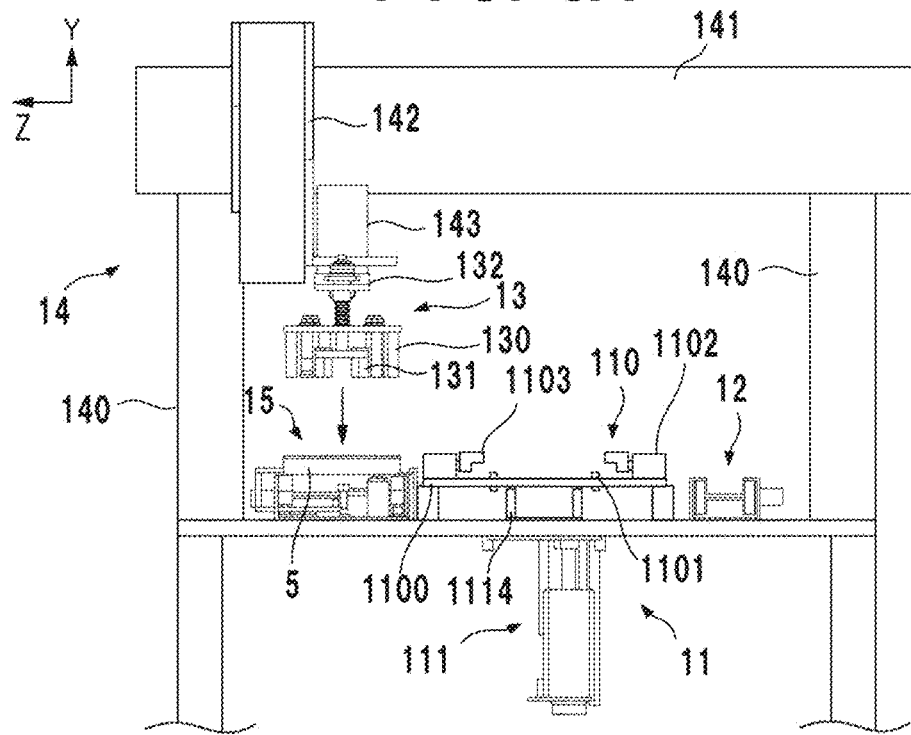
F I G. 8B
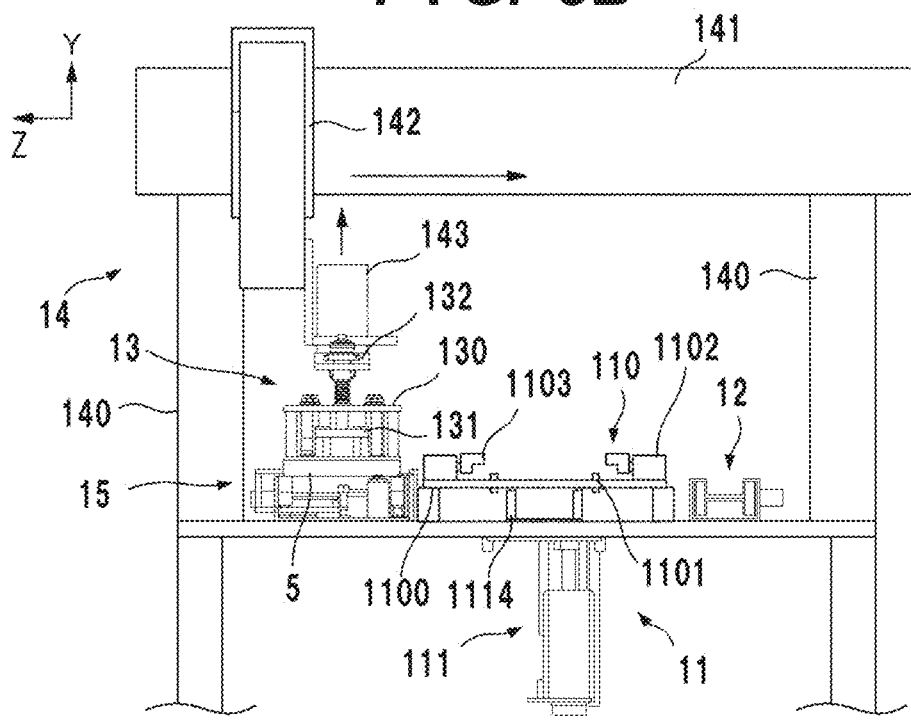

TRANSFER METHOD, HOLDING APPARATUS, AND TRANSFER SYSTEM

BACKGROUND OF THE INVENTION

1. Field of the Invention

The present invention relates to a transfer method, a holding apparatus, and a transfer system.

2. Description of the Related Art

When a substrate is transported to a processing apparatus or the like, a relatively thin substrate such as a flexible substrate sometimes warps, and transportation becomes difficult. To solve this, there is proposed a method of transporting a substrate to a transport destination while holding the substrate by a carrier. This requires a mechanism of extracting only a substrate from the carrier and transferring it to a processing apparatus or the like. Japanese Patent Laid-Open No. 2010-272650 discloses an apparatus in which the cover of a substrate is removed and the substrate is pushed up by pins and extracted.

The apparatus in Japanese Patent Laid-Open No. 2010-272650 requires two steps: a step of removing and moving a cover, and a step of extracting and moving a substrate. There is room for improvement of the transfer efficiency of a substrate.

SUMMARY OF THE INVENTION

It is an object of the present invention to improve the transfer efficiency of a substrate.

According to an aspect of the present invention, there is provided a transfer method of transferring, from a carrier including a placing portion on which a substrate is placed and a cover that is superposed on an upper surface of the placing portion in close contact, the substrate held between the placing portion and the cover, comprising: a holding step of holding the substrate and the cover on the placing portion by a holding apparatus; and a moving step of moving the holding apparatus to move the substrate and the cover from the placing portion to a transfer destination, wherein in the holding step, the cover is held by a cover holding unit of the holding apparatus, and the substrate is held by a substrate holding unit of the holding apparatus in parallel postures of the cover and substrate.

According to another aspect of the present invention, there is provided a holding apparatus that holds, from a carrier including a placing portion on which a substrate is placed, and a cover that is superposed on an upper surface of the placing portion in close contact, the substrate held between the placing portion and the cover, and the cover, comprising: a cover holding unit configured to hold the cover; a substrate holding unit configured to hold the substrate; and a support unit configured to support the cover holding unit and the substrate holding unit, wherein the support unit supports the cover holding unit to be able to displace the cover holding unit in directions in which the cover holding unit moves close to and apart from the carrier.

According to still another aspect of the present invention, there is provided a transfer system that transfers, from a carrier including a placing portion on which a substrate is placed, and a cover that is superposed on an upper surface of the placing portion in close contact, the substrate held between the placing portion and the cover, comprising: a positioning unit configured to position and hold the placing portion of the carrier; a separation unit configured to separate the cover from the placing portion of the carrier held by the positioning unit; the holding apparatus; and a moving apparatus configured to move the holding apparatus.

Further features of the present invention will become apparent from the following description of exemplary embodiments (with reference to the attached drawings).

BRIEF DESCRIPTION OF THE DRAWINGS

FIGS. 8A and 8B are views for explaining the operation of the transfer system in FIG. 1;

DESCRIPTION OF THE EMBODIMENTS

First Embodiment

Figure 1:
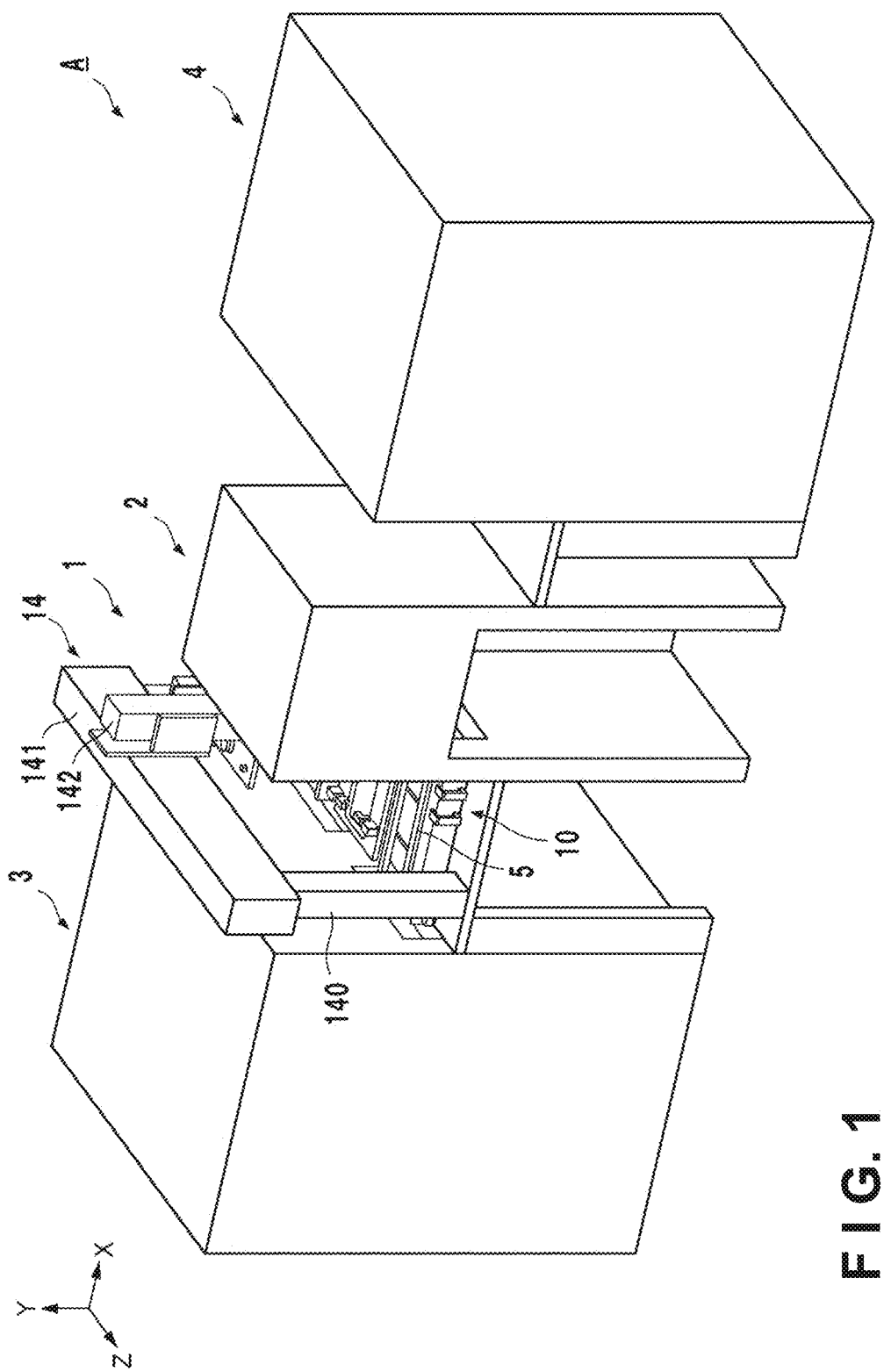
FIG. 1 is a schematic view showing a substrate processing facility to which a transfer system according to one embodiment of the present invention is applied.

The first embodiment of the present invention will now be described. In the drawings, an arrow Y indicates the vertical direction, and arrows X and Z indicate horizontal directions perpendicular to each other.

<Substrate Processing Facility>

FIG. 1 is a schematic view showing a substrate processing facility A to which a transfer system 1 according to one embodiment of the present invention is applied. The substrate processing facility A includes the transfer system 1, a storage apparatus 2, a processing apparatus 3, and a processing apparatus 4.

The storage apparatus 2 can store a plurality of carriers 5 (to be described later). The carrier 5 is a tool for holding a substrate. Examples of the substrate are a flexible film-like substrate typified by an FPC (Flexible Printed Circuit) board, a flexible film, a flexible sheet, and a flexible foil. The storage apparatus 2 can store the carrier 5 that holds a substrate W, or the empty carrier 5 from which the substrate W has been extracted. The storage apparatus 2 is an apparatus which supplies the carrier 5 to the transfer system 1, and recovers the carrier 5 from the transfer system 1.

The processing apparatus 3 is an apparatus that performs, for example, heat treatment (reflow) of applied solder. The processing apparatus 4 is, for example, an apparatus that performs cooling and cleaning processing. The transfer system 1 includes a transport apparatus 10 for loading the carrier 5 holding the substrate W from the processing apparatus 3. The transport apparatus 10 extracts the substrate W from the carrier 5, and transports the extracted substrate to the processing apparatus 4. The empty carrier 5 from which the substrate W has been extracted is transported to the storage apparatus 2.

<Transfer System>

Figure 2:
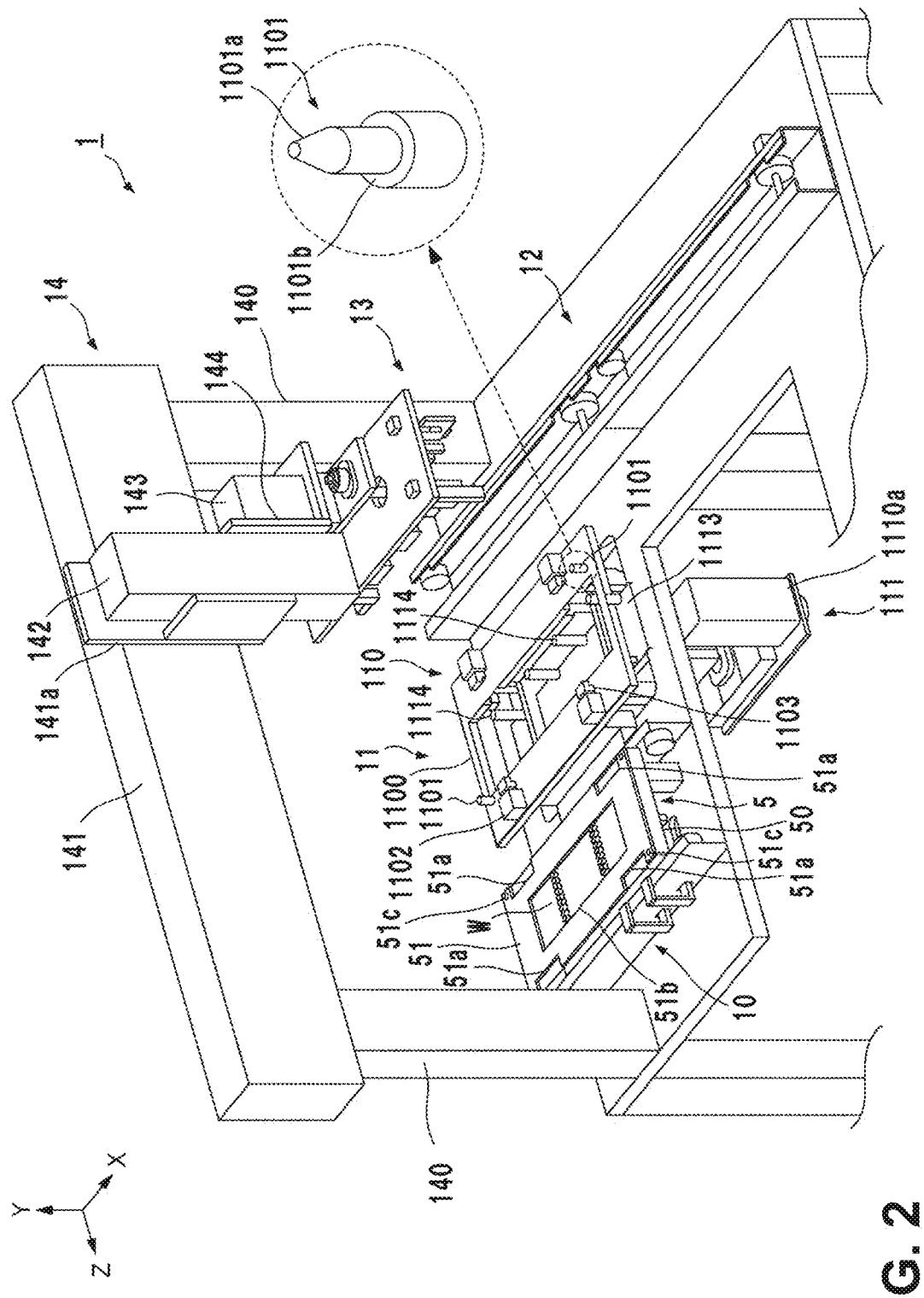
FIG. 2 is a schematic view showing the transfer system in FIG. 1.

FIG. 2 is a schematic view showing the transfer system 1. The transfer system 1 includes the transport apparatus 10, a carrier processing apparatus 11, a transport apparatus 12, a holding apparatus 13, and a moving apparatus 14. The support structure and arrangement of the transport apparatus 10, carrier processing apparatus 11, transport apparatus 12, and moving apparatus 14 are not particularly limited. In this embodiment, the transport apparatus 10, the carrier processing apparatus 11, the transport apparatus 12, and the moving apparatus 14 are arranged on a frame having a base portion. The transport apparatuses 10 and 12 are arranged so that their transport directions become parallel to each other and the transport apparatuses 10 and 12 are spaced apart from each other in a direction perpendicular to the transport direction. The carrier processing apparatus 11 is interposed between the transport apparatuses 10 and 12. The moving apparatus 14 is arranged to be able to move the holding apparatus 13 between the transport apparatus 10, the carrier processing apparatus 11, and the transport apparatus 12.

The transport apparatus 10 includes, for example, a belt conveyor mechanism extending in the X direction serving as the transport direction. The transport apparatus 10 transports the carrier 5 placed on a belt (not shown) while keeping the horizontal posture of the carrier 5. The example in FIG. 2 shows a state in which the carrier 5 is mounted on the transport apparatus 10. The transport apparatus 10 loads the carrier 5 from the processing apparatus 3 and unloads the carrier 5 to the storage apparatus 2. The carrier 5 from the processing apparatus 3 holds the substrate W. The empty carrier 5 from which the substrate W has been extracted is unloaded to the storage apparatus 2.

The carrier 5 includes a placing portion 50 at which the substrate W is placed, and a cover 51 that is superposed on the upper surface of the placing portion 50 in close contact. Both the placing portion 50 and the cover 51 are plate-like members, and have a square shape in this embodiment. The placing portion 50 and the cover 51 attract (are coupled to) each other by magnetic force. In this case, for example, it is possible to arrange a permanent magnet at the placing portion 50, and make the cover 51 of a metal material that is attracted to the magnet. As for close contact/coupling between the placing portion 50 and the cover 51, they may be physically pinched by a clamp member or the like, in addition to attraction by magnetic force.

The substrate W is sandwiched and held between the placing portion 50 and the cover 51. The cover 51 includes a plurality of notches 51a, an opening 51b, and positioning holes 51c. The notches 51a are formed near the four corners of the cover 51. The notches 51a are formed to prevent interference with the cover 51 when the carrier processing apparatus 11 (to be described later) holds the placing portion 50. The opening 51b forms an exposure portion at which the substrate W and the cover 51 do not overlap each other. In this embodiment, the opening 51b is formed at the center of the cover 51, but the position of the opening 51b is arbitrary. Also, the opening 51b may be replaced with a notch. Further, the size of the cover 51 may be designed to be smaller than that of the substrate W so that the substrate W is exposed outside the periphery of the cover 51. The holes 51c are through holes formed at the four corners of the cover 51. At the four corners of the placing portion 50, holes 50a are formed at positions where they overlap the holes 51c (see FIG. 3).

The transport apparatus 12 unloads the substrate W to the processing apparatus 4. The transport apparatus 12 includes, for example, a belt conveyor mechanism extending in the X direction. The transport apparatus 12 transports the substrate W directly placed on a belt (not shown) while keeping the horizontal posture of the substrate W.

Figure 3:
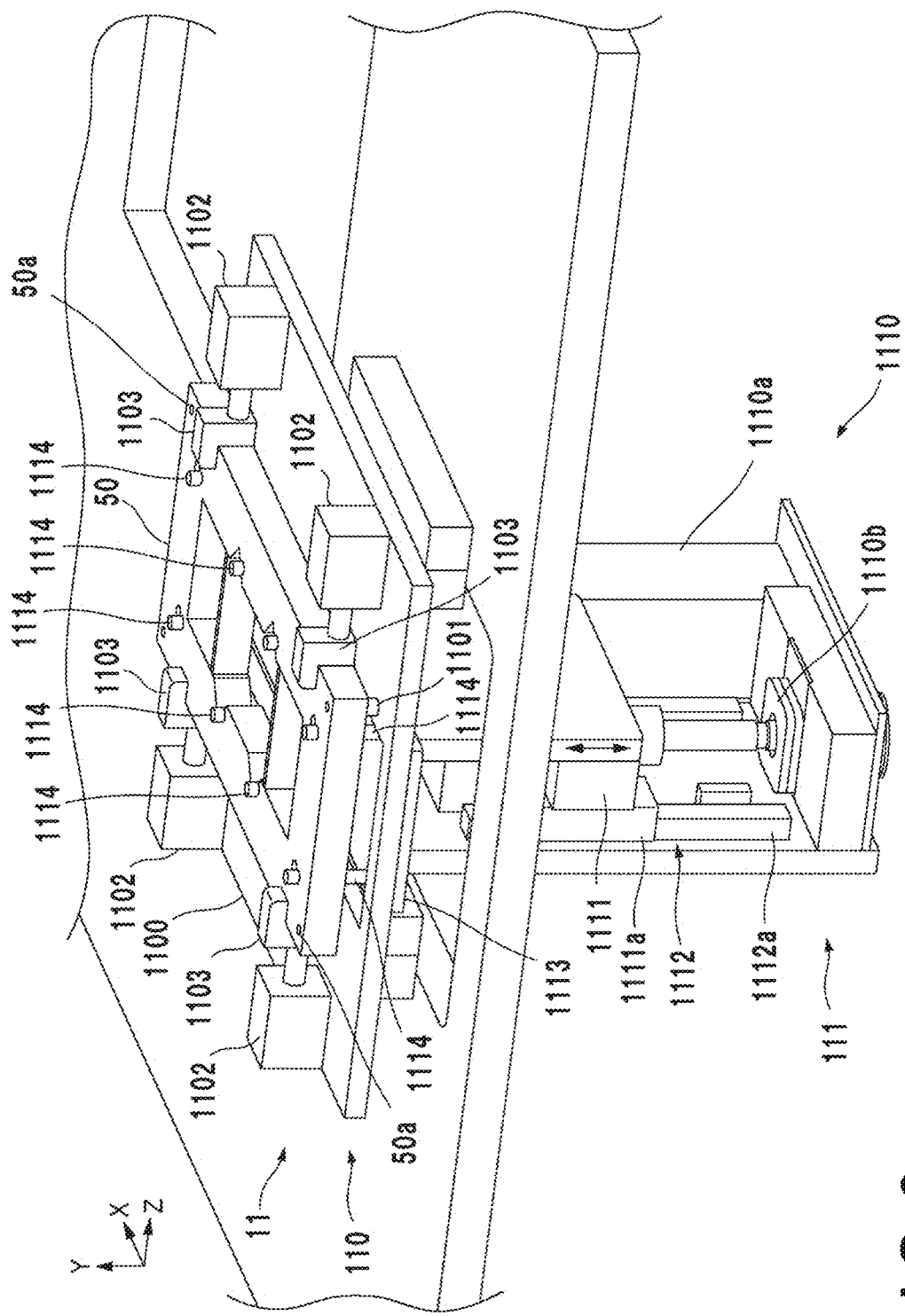
FIG. 3 is a schematic view showing the carrier processing apparatus of the transfer system in FIG. 1.

The carrier processing apparatus 11 is interposed between the transport apparatuses 10 and 12. The carrier processing apparatus 11 will be explained with reference to FIGS. 2 and 3. FIG. 3 is a schematic view showing the carrier processing apparatus 11. The carrier processing apparatus 11 includes a positioning unit 110 and a separation unit 111. FIG. 3 shows a state in which the positioning unit 110 holds the placing portion 50.

The positioning unit 110 is a unit that positions and holds the carrier 5. In this embodiment, the positioning unit 110 grips and positions the placing portion 50. The positioning unit 110 includes a base member 1100, a plurality of placing pins 1101, a plurality of actuators 1102, and a plurality of positioning members 1103.

The base member 1100 is a plate-like member and supports the above-described components. An opening through which a pin support table 1113 and abutment members 1114 of the separation unit 111 (to be described later) can pass is formed at the center of the base member 1100. The abutment member 1114 is a pin in this embodiment. In some cases, the abutment member 1114 will be called the pin 1114.

Each placing pin 1101 stands on the base member 1100, and includes a guide portion 1101a having a distal end portion formed into a conical shape, and a support surface 1101b that supports the lower surface of the placing portion 50. In this embodiment, the placing pins 1101 are arranged at two portions. Holes in which the placing pins 1101 are fitted with play are formed in the lower surface of the placing portion 50. While the placing portion 50 is guided, it is supported and mounted on the support surfaces of the placing pins 1101.

Each actuator 1102 is, for example, an electric cylinder, and reciprocates the corresponding positioning member 1103 in the Z direction. In this embodiment, one actuator 1102 is assigned to one positioning member 1103.

Each positioning member 1103 has an L shape constituted by a vertical portion and a horizontal portion. The positioning member 1103 abuts against the periphery of the placing portion 50 from the upper and side portions, and positions and holds the placing portion 50. In this embodiment, two positioning members 1103 are assigned to each of two facing sides of the placing portion 50. By driving of each actuator 1102, the vertical and horizontal portions of the positioning members 1103 abut against the two facing sides of the placing portion 50 to sandwich and position the placing portion 50 and hold it in the horizontal posture.

The separation unit 111 is a unit that separates, from the placing portion 50, the cover 51 chucked to the placing portion 50. The separation unit 111 includes a driving unit 1110, an elevating member 1111, a guide portion 1112, the pin support table 1113, and the plurality of pins 1114. The driving unit 1110 includes a driving source 1110a such as a motor, and a transmission mechanism 1110*b* that transmits the driving force of the driving source 1110*a* to the elevating member 1111. The transmission mechanism 1110*b* is, for example, a ball screw mechanism, and moves up and down the elevating member 1111 by the driving force of the driving source 1110*a*. The guide portion 1112 guides up/down movement of the elevating member 1111. In this embodiment, the guide portion 1112 includes a rail 1112*a* extending in the Y direction serving as the up/down movement direction. A slider 1111*a* coupled to the elevating member 1111 is engaged with the rail 1112*a*.

The pin support table 1113 is a plate-like member that is coupled to the elevating member 1111 and moves up and down together with the elevating member 1111. The plurality of pins 1114 each have a support-portion-side distal end formed into a horizontal surface, and stand on the pin support table 1113. Through holes or notches capable of receiving the pins 1114 are formed in the placing portion 50. Along with up/down movement of the pin support table 1113, each pin 1114 can move between a working position (position in FIG. 3) set at an upper position, and a retreat position set at a position below the placing portion 50. At the working position, the pin 1114 projects from the upper surface of the placing portion 50.

When separating the cover 51 from the placing portion 50 held by the positioning unit 110, the pins 1114 are moved up from the retreat positions to the working positions, abut against the lower surface of the cover 51, and push up the cover 51. Accordingly, the cover 51 is separated from the placing portion 50 and lifted above the placing portion 50.

The moving apparatus 14 will be explained with reference to FIG. 2. The moving apparatus 14 can move the holding apparatus 13 in the Y and Z directions. The moving apparatus 14 moves the holding apparatus 13 vertically and horizontally between the transport apparatus 10 and the carrier processing apparatus 11, and between the carrier processing apparatus 11 and the transport apparatus 12.

The moving apparatus 14 includes a pair of columns 140 that are spaced apart from each other in the Z direction serving as the transport direction and extend in the Y direction, a guide unit 141 installed across the pair of columns 140, a horizontally moving member 141*a* supported to be movable in the Z direction along the guide unit 141, an elevating unit 142 attached to the horizontally moving member 141*a*, an elevating member 144 that is moved up and down by the elevating unit 142, and a pivot unit 143 attached to the elevating member 144. The elevating member 144 supports the pivot unit 143. The pivot unit 143 is connected to the holding apparatus 13, and pivots the substrate W and cover 51 held by the holding apparatus 13 in a state in which the surfaces of the substrate W and cover 51 are parallel to the X-Z plane (horizontal plane), thereby adjusting the angle of the held substrate W or cover 51 on the X-Z plane. A mechanism of moving the elevating unit 142 by the guide unit 141, and a mechanism of moving up and down the elevating member 144 by the elevating unit 142 can be well-known mechanisms. Such a mechanism can be constituted by, for example, a driving source such as a motor, and a transmission mechanism (for example, a belt transmission mechanism, ball screw mechanism, or rack and pinion mechanism) that transmits the driving force of the driving source. When sensors such as encoders that detect the positions of the horizontally moving member 141*a* and elevating member 144 are arranged on the guide unit 141 and the elevating unit 142, movement control of the holding apparatus 13 can be performed based on the detection results of the respective sensors. This embodiment employs a traverse mechanism that linearly moves the holding apparatus 13. Alternatively, the holding apparatus 13 may be mounted at the distal end of each of various moving mechanisms such as a vertically articulated robot.

Figure 4A:
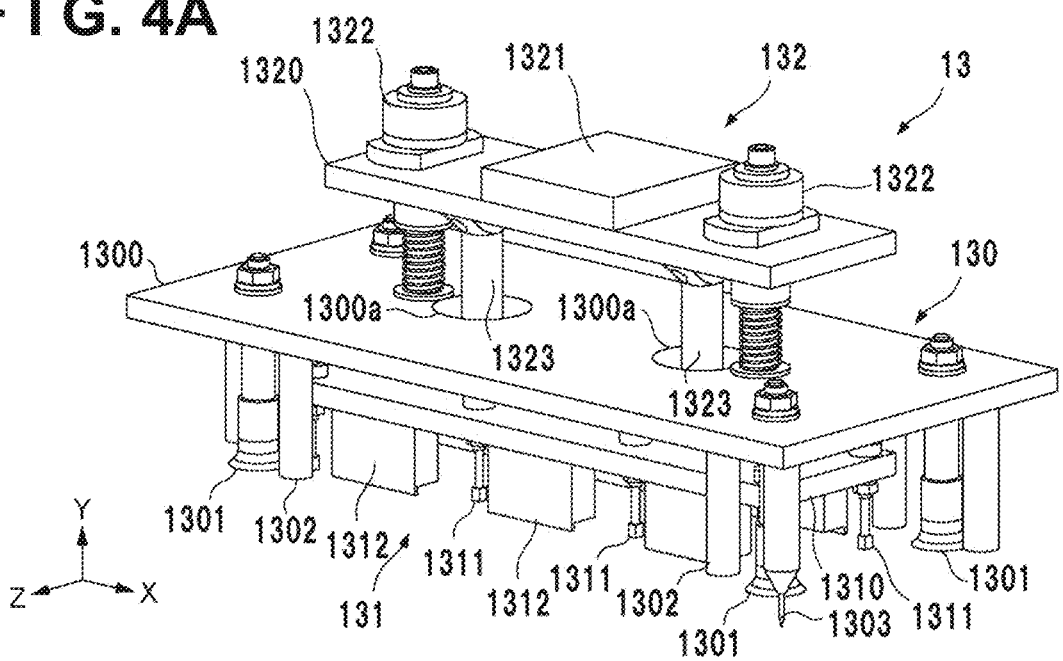
FIGS. 4A and 4B are schematic views showing the holding apparatus of the transfer system in FIG. 1.
Figure 4B:
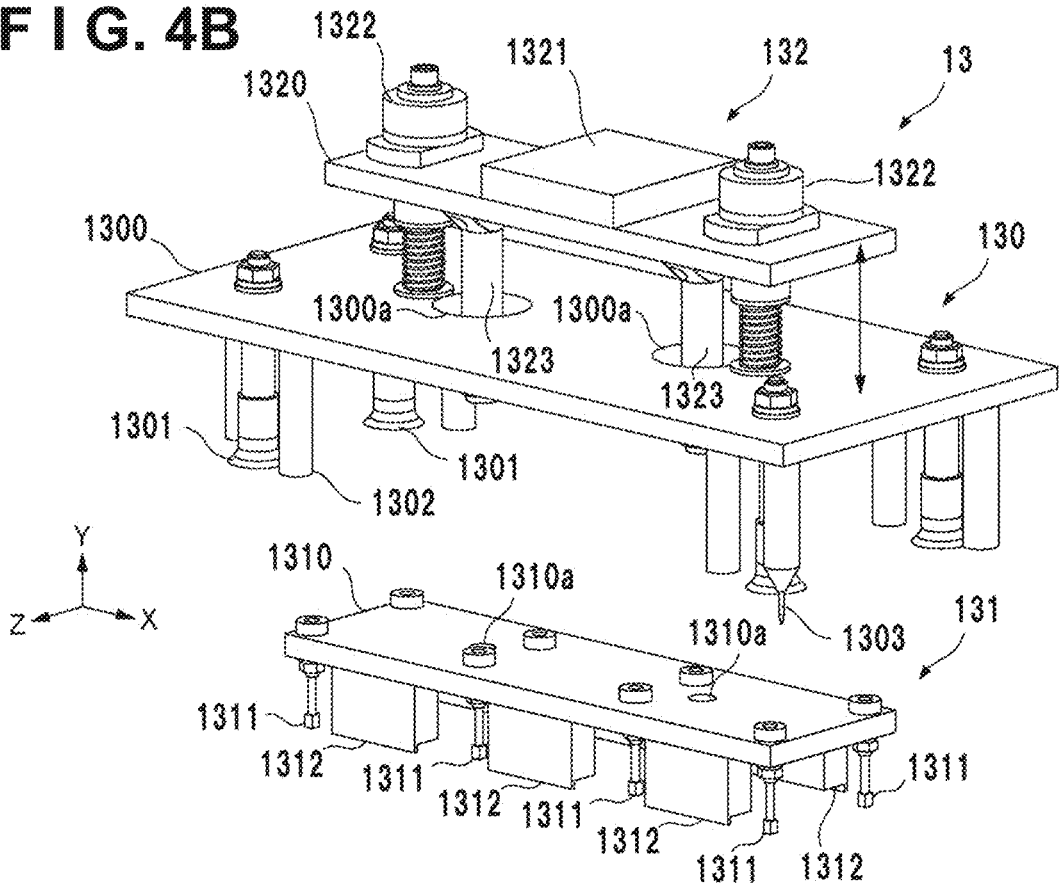
Figure 5A:
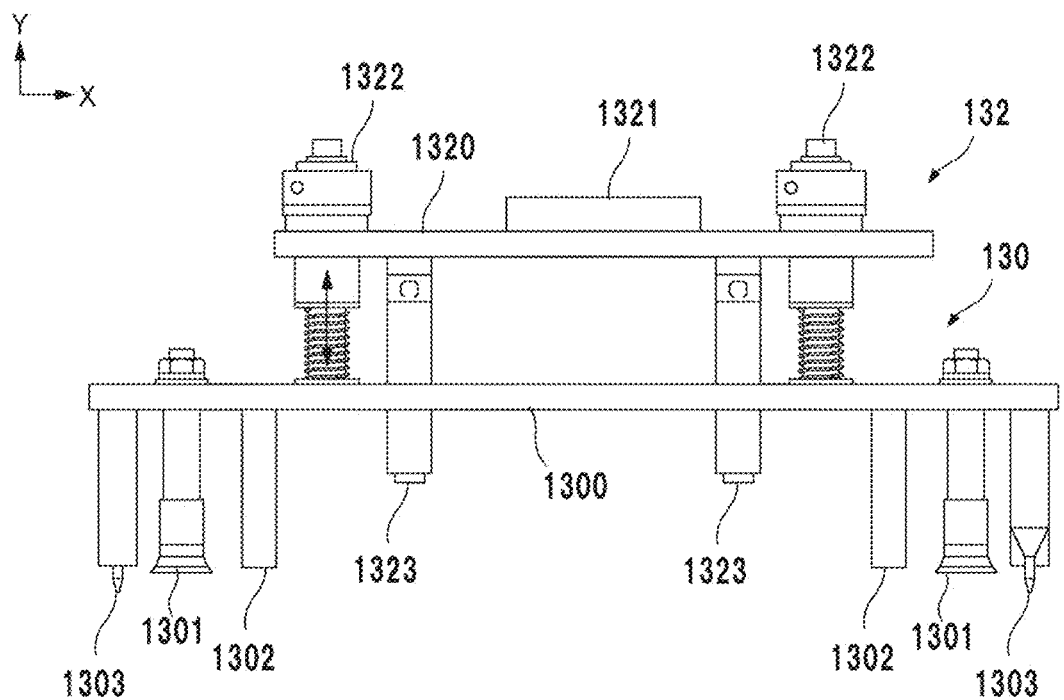
FIGS. 5A and 5B are schematic views showing a cover holding unit.
Figure 5B:
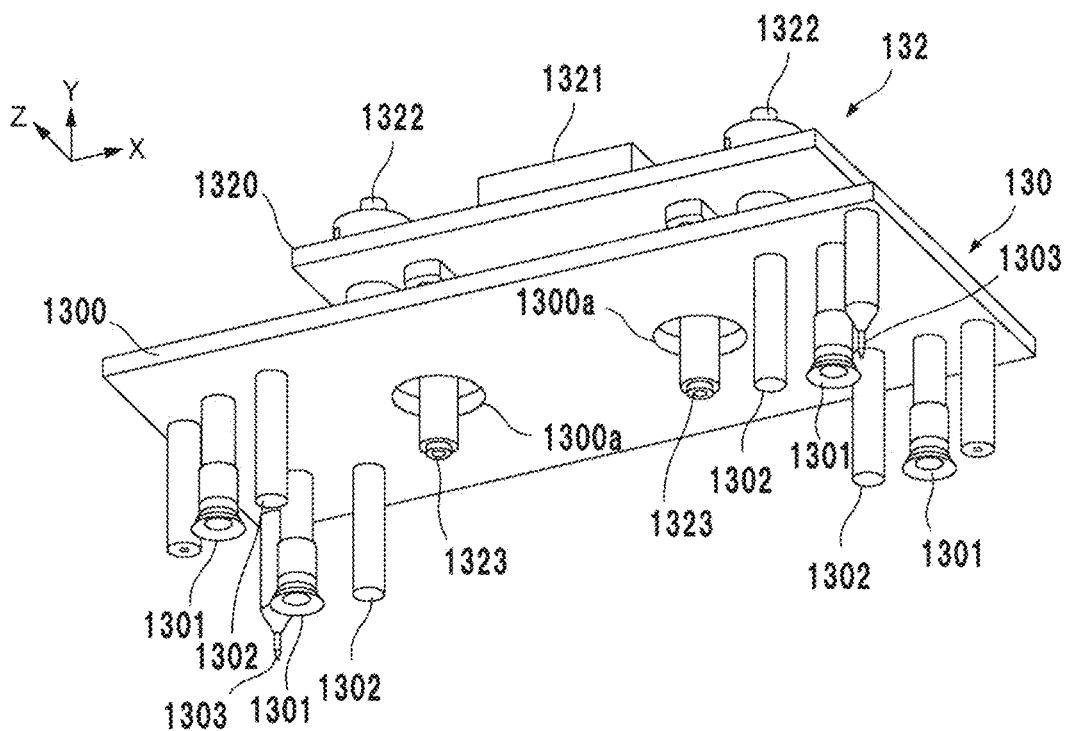
Figure 6A:
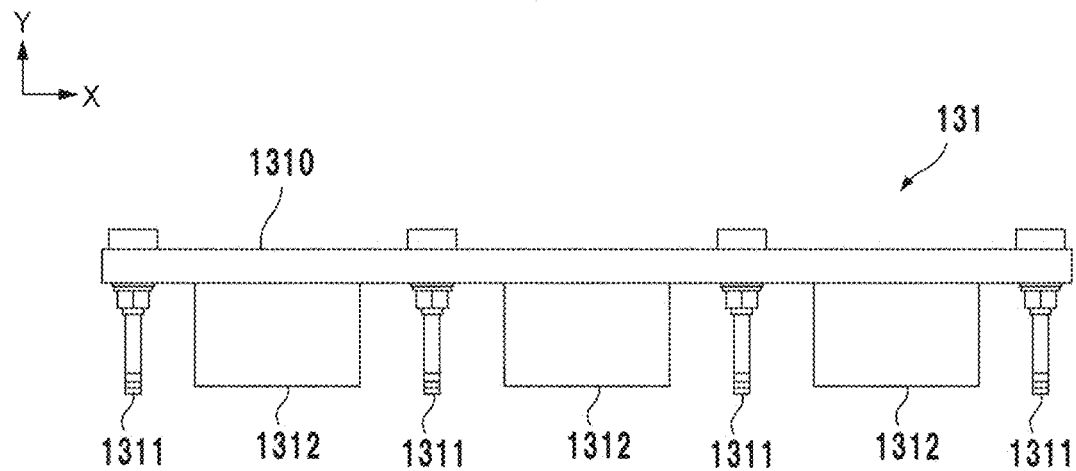
FIGS. 6A and 6B are schematic views showing a substrate holding unit.
Figure 6B:
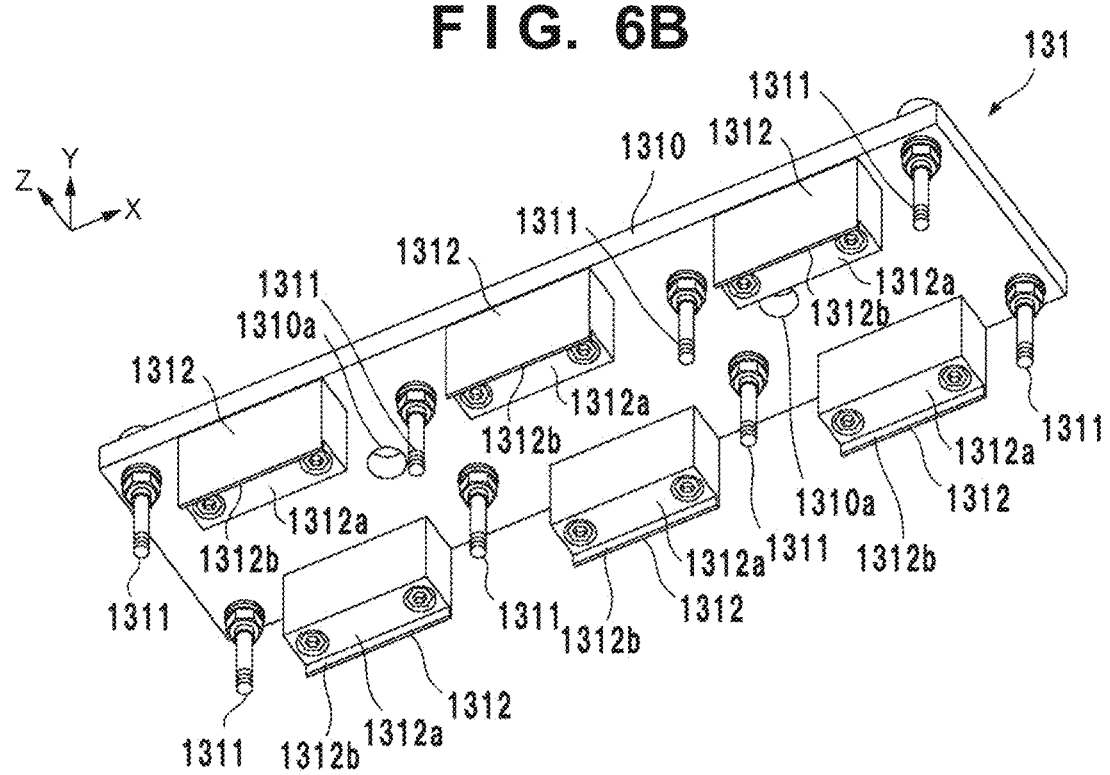

The holding apparatus 13 will be explained with reference to FIGS. 4A to 6B. FIGS. 4A and 4B are schematic views showing the holding apparatus 13. FIG. 4A is a perspective view showing the holding apparatus 13, and FIG. 4B is an exploded perspective view showing the holding apparatus 13. FIGS. 5A and 5B are schematic views showing a cover holding unit 130. FIGS. 6A and 6B are schematic views showing a substrate holding unit 131.

The holding apparatus 13 includes the cover holding unit 130, the substrate holding unit 131, and a support unit 132 that supports them.

The cover holding unit 130 is a unit that holds the cover 51 of the carrier 5 to freely cancel holding. The cover holding unit 130 includes a base member 1300, chucking portions 1301, cover regulating members 1302, and positioning members 1303.

The base member 1300 is a plate-like member, and has openings 1300*a* (two openings 1300*a* are illustrated in this embodiment) through which support portions 1323 of the support unit 132 (to be described later) are inserted. The openings 1300*a* are formed in correspondence with the support portions 1323, and the number of openings 1300*a* may be one or three or more.

Each chucking portion 1301 chucks the cover 51. The chucking portion 1301 is supported by the base member 1300 so as to project below the base member 1300. A chucking pad that sucks air is attached to the distal end portion of the chucking portion 1301. By sucking air by a pump (not shown) through the suction pores of the chucking pad, the cover 51 can be sucked at a negative pressure and held. By stopping the suction and releasing the cover 51 to the atmospheric pressure, the holding of the cover 51 is canceled. In this embodiment, four chucking portions 1301 are arranged. The chucking portions 1301 chuck four portions of the upper surface of the cover 51, and hold the cover 51 in the horizontal posture together with the cover regulating members 1302.

Each cover regulating member 1302 is a member that regulates the holding position (holding height) of the cover 51 on the cover holding unit 130. The cover regulating member 1302 can stably hold the posture of the cover 51. The cover regulating member 1302 is supported by the base member 1300 so as to project below the base member 1300. The cover regulating member 1302 has a horizontal positioning surface at its distal end portion. The upper surface of the cover 51 abuts against the positioning surface at the time of chucking the cover 51, and the cover regulating member 1302 regulates the position of the cover 51 in the chucking direction (Y direction) to hold the horizontal posture of the cover 51. In this embodiment, four cover regulating members 1302 are arranged. The cover regulating members 1302 abut against four portions of the upper surface of the cover 51, and regulate the position of the cover 51 in the chucking direction.

Each positioning member 1303 is a member that positions the cover holding unit 130 with respect to the carrier 5. The positioning member 1303 is supported by the base member 1300 so as to project below the base member 1300. A pin is attached to the distal end portion of the positioning member 1303. By inserting this pin into the hole 50*a* of the placing portion 50 and the hole 51*c* of the cover 51 and engaging it with the holes at the time of down movement, relative positioning of the positioning member 1303 and carrier 5 in the horizontal direction can be performed. In this embodiment, two positioning members 1303 are arranged. The positioning members 1303 are engaged with the placing portion 50 at two portions (more specifically, two portions diagonally), and regulate the relative position.

The substrate holding unit 131 is a unit that holds the substrate W to freely cancel holding. The substrate holding unit 131 includes a base member 1310, chucking portions 1311, and substrate regulating members 1312. The base member 1310 is a plate-like member. Attaching holes 1310a (two attaching holes 1310a are illustrated in this embodiment) in which the support portions 1323 of the support unit 132 (to be described later) are fixed are formed in the base member 1310.

Each chucking portion 1311 chucks the substrate W. The chucking portion 1311 is supported by the base member 1300 so as to project below the base member 1300. A bellows pad that sucks air is attached to the distal end portion of the chucking portion 1311. By sucking air by a pump (not shown) through the suction pores of the bellows pad, the substrate W can be sucked at a negative pressure and held. By stopping the suction and releasing the substrate W to the atmospheric pressure, the holding of the substrate W is canceled. In this embodiment, eight chucking portions 1311 are arranged. The chucking portions 1311 chuck the upper surface of the substrate W at eight portions, and hold the substrate W in the horizontal posture together with the substrate regulating members 1312. The chucking portions 1311 are arranged at positions where they do not interfere with the substrate regulating members 1312 (to be described later), and near the substrate regulating members 1312. The chucking portions 1311 are arranged to sandwich each substrate regulating member 1312. The chucking portions 1311 hold the substrate W while reliably making the upper surface of the substrate W abut against positioning portions 1312b (to be described later).

Each substrate regulating member 1312 is a member that regulates the holding position of the substrate W in the substrate holding unit 131. The substrate regulating member 1312 is supported by the base member 1310 so as to project below the base member 1310. The distal end portion of the substrate regulating member 1312 has a horizontal attaching portion 1312a, and a positioning portion 1312b formed to project from the attaching portion 1312a. The attaching portion 1312a is used at the time of attachment to the base member 1310 by a fastening member such as a bolt. At the time of chucking the substrate W, part of the upper surface of the substrate W abuts against the lower surface of the positioning portion 1312b to regulate the position of the substrate W in the chucking direction (Y direction). In this embodiment, six substrate regulating members 1312 are arranged on the lower side of the base member 1310, and the lower surfaces of the respective positioning portions 1312b are arranged on the same horizontal plane (flush with each other). Sets each of three substrate regulating members 1312 are linearly aligned in two arrays. The positioning portions 1312b forming each array are linearly arranged, and the respective arrays are arranged line-symmetrically with respect to the center line of the base member 1310. By arranging the plurality of positioning portions 1312b, the flexion of the substrate W at the time of chucking can be prevented, and the substrate W can be held in the horizontal posture. In some cases, even one positioning portion 1312b can hold the substrate W in the horizontal posture when the lower surface of the positioning portion 1312b has a large area.

The support unit 132 is a unit that supports the cover holding unit 130 and the substrate holding unit 131, and is connected to the pivot unit 143 of the moving apparatus 14.

The support unit 132 includes a base member 1320, support portions 1322, and the support portions 1323. The base member 1320 is a plate-like member. A connecting member 1321 to which the pivot unit 143 (in particular, its rotation output portion) is connected is arranged at the center portion of the upper surface of the base member 1320. A bolt hole or the like through which the connecting member 1321 is fastened to, for example, the pivot unit 143 is formed in the connecting member 1321.

Each support portion 1322 has one end side connected to the base member 1320, and the other end side connected to the base member 1300 of the cover holding unit 130. The support portion 1322 supports the cover holding unit 130. In this embodiment, two support portions 1322 are arranged apart from each other in the X direction. In this embodiment, the cover holding unit 130 is supported (suspended) to be displaceable in directions in which it moves close to and apart from the carrier 5. Since the plurality of support portions 1322 are arranged, the cover holding unit 130 is supported not only to be displaceable in the directions in which it moves close to and apart from the carrier 5, but also to be inclinable with respect to the horizontal plane.

In this embodiment, the support portion 1322 is constituted as a floating mechanism that floatingly supports the cover holding unit 130. The support portion 1322 can displace the cover holding unit 130.

More specifically, the support portion 1322 is constituted by a rod cylinder and a spring. The cylinder portion of the rod cylinder is fixed to the base member 1320, and the rod portion is fixed to the base member 1300. The spring is interposed between the cylinder portion and the base member 1300 to surround the rod portion. By the projection/retraction amount of the rod portion with respect to the cylinder portion, the base member 1300 can be displaced in a direction (Y direction) in which the base member 1300 moves close to or apart from the base member 1320. As a result, when holding the cover 51, the cover holding unit 130 can be displaced with respect to the support unit 132 in the direction in which it moves close to or apart from the carrier 5. The spring biases the base members 1300 and 1320 in directions in which they move apart from each other.

Each support portion 1323 has one end side connected to the base member 1320, and the other end side connected to the base member 1310 through the opening 1300a formed in the base member 1300. The support portion 1323 supports (suspends) the substrate holding unit 131. In this embodiment, two support portions 1323 are arranged apart from each other in the X direction. The support portion 1323 is a column-like member, and the base member 1310 is fixed to the distal end portion of the support portion 1323. Unlike the cover holding unit 130, the substrate holding unit 131 is supported not to be displaced with respect to the support unit 132. Both the base members 1310 and 1320 are maintained in the horizontal posture. The base member 1300 is basically maintained in the horizontal posture though it is slightly inclined owing to the contraction/extension of the support portions 1322.

<Control Unit>

Figure 7:
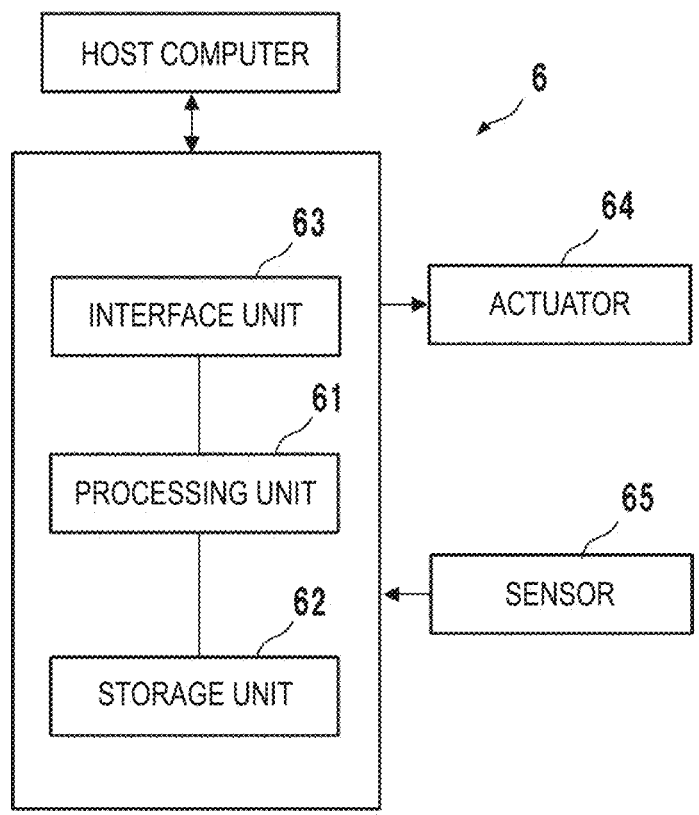
FIG. 7 is a block diagram showing a control unit.

FIG. 7 is a block diagram showing a control unit 6 of the transfer system 1. The control unit 6 controls the overall transfer system 1.

The control unit 6 includes a processing unit 61 such as a CPU, a storage unit 62 such as a RAM or ROM, and an interface unit 63 that interfaces an external device and the processing unit 61. The interface unit 63 includes a communication interface that communicates with a host computer, in addition to an I/O interface. The host computer is, for example, a computer that controls the overall substrate processing facility A.

The processing unit 61 executes a program stored in the storage unit 62, and controls the detection results of various sensors 65, and various actuators 64. The sensors 65 include, for example, a sensor that detects the position of the elevating member 144. The actuators 64 include, for example, the driving sources of the transport apparatus 10, carrier processing apparatus 11, transport apparatus 12, and moving apparatus 14, and a pump and control valve for performing negative-pressure suction in the holding apparatus 13.

<Control Example>

A control example of the transfer system 1 will be described with reference to FIGS. 8A to 13B. An operation of transferring the substrate W will be explained here. More specifically, an example in which the substrate W is extracted from the carrier 5 that holds the substrate W and has been loaded onto the transport apparatus 10, and the substrate W is transferred to a transfer destination will be described. In this example, the transfer destination of the substrate W is the transport apparatus 12.

FIG. 8A shows a state in which the carrier 5 that holds the substrate W and has been supplied from the processing apparatus 3 is loaded to a predetermined position on the transport apparatus 10. First, as shown in FIG. 8A, the moving apparatus 14 moves the holding apparatus 13 to above the carrier 5. The pivot unit 143 adjusts the rotation angle of the holding apparatus 13 on the horizontal plane. Then, as shown in FIG. 8B, the moving apparatus 14 moves down the holding apparatus 13, and the holding apparatus 13 holds the carrier 5. At this time, the positioning members 1303 of the cover holding unit 130 are inserted in and engaged with the holes 50a of the placing portion 50 and the holes 51c of the cover 51 during the down movement of the holding apparatus 13. As a result, horizontal positioning of the holding apparatus 13 and carrier 5 is performed. Subsequently, suction of the chucking portions 1301 of the cover holding unit 130 starts to chuck and hold the cover 51. At this time, the cover regulating members 1302 regulate the holding position. Since the cover 51 and the placing portion 50 are coupled by magnetic force, the holding apparatus 13 holds the overall carrier 5 including the substrate W by chucking and holding the cover 51.

Figure 9A:
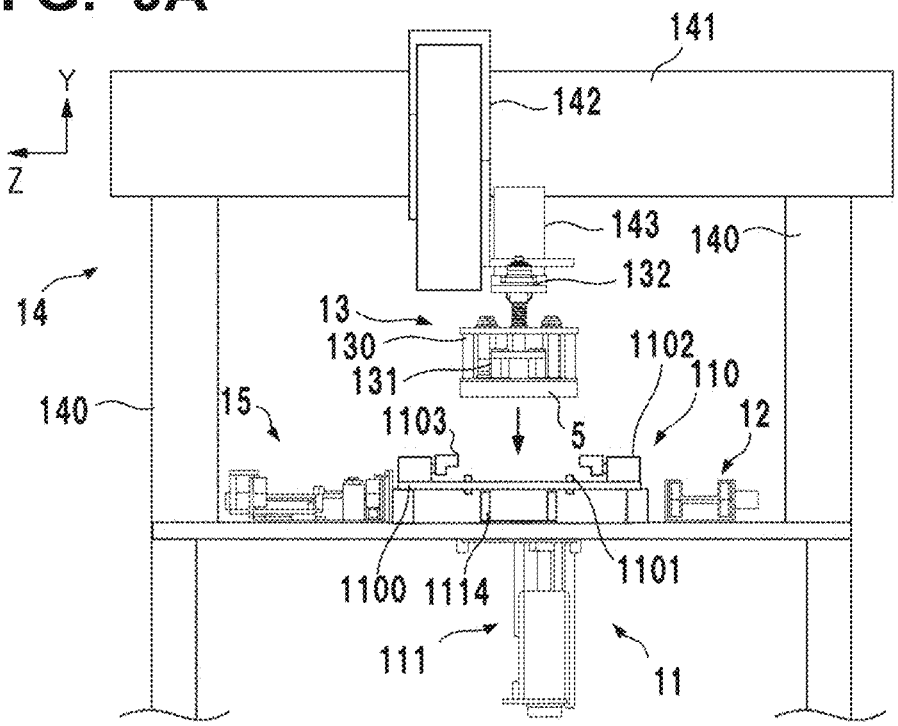
FIGS. 9A and 9B are views for explaining the operation of the transfer system in FIG. 1.
Figure 9B:
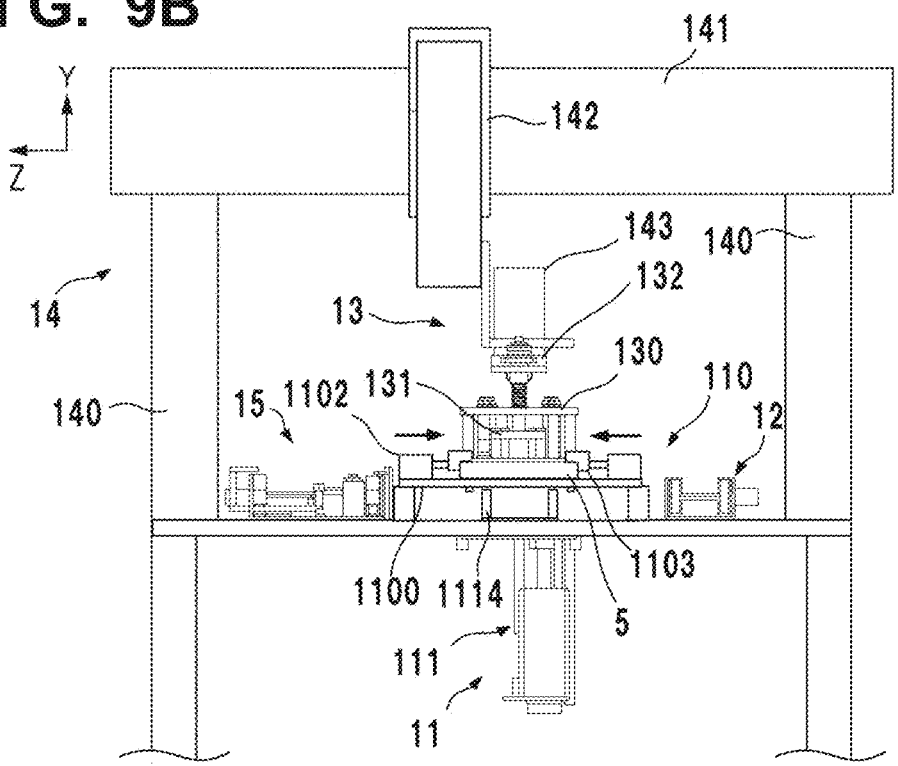

Then, as shown in FIG. 9A, the moving apparatus 14 moves the holding apparatus 13 holding the carrier 5 to above the carrier processing apparatus 11. The pivot unit 143 adjusts the rotation angle of the holding apparatus 13 on the horizontal plane. Subsequently, as shown in FIG. 9B, the moving apparatus 14 moves down the holding apparatus 13 to place the carrier 5 on the placing pins 1101 of the positioning unit 110. Further, the actuators 1102 are driven to make the positioning members 1103 abut against the placing portion 50, and position and hold the placing portion 50. Since the notches 51a are formed in the cover 51, the cover 51 and the positioning members 1103 do not interfere with each other when the positioning members 1103 abut against the placing portion 50.

Figure 10A:
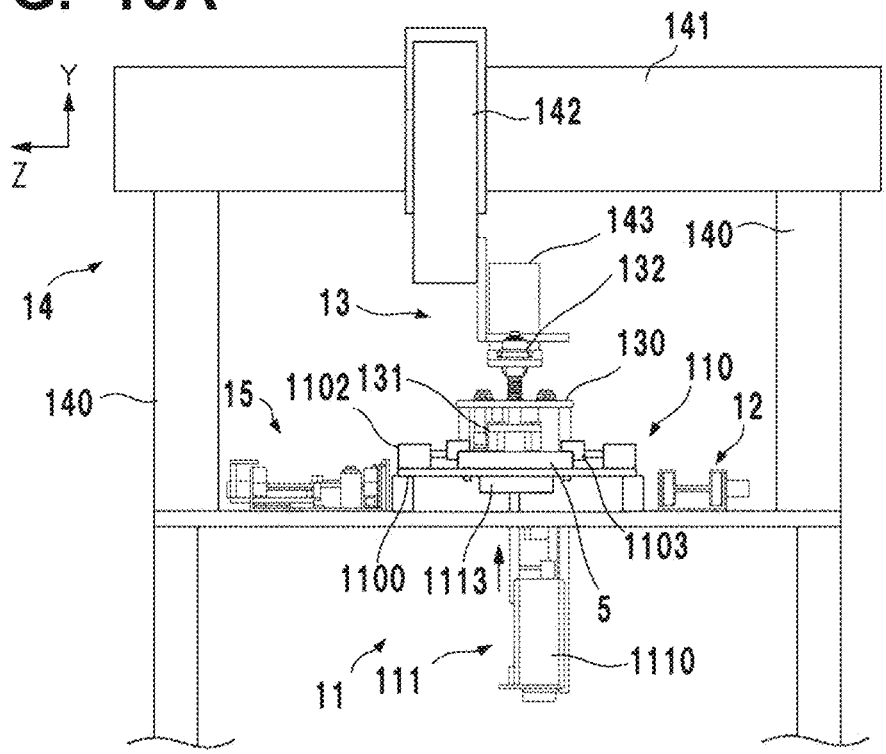
FIGS. 10A and 10B are views for explaining the operation of the transfer system in FIG. 1.
Figure 10B:
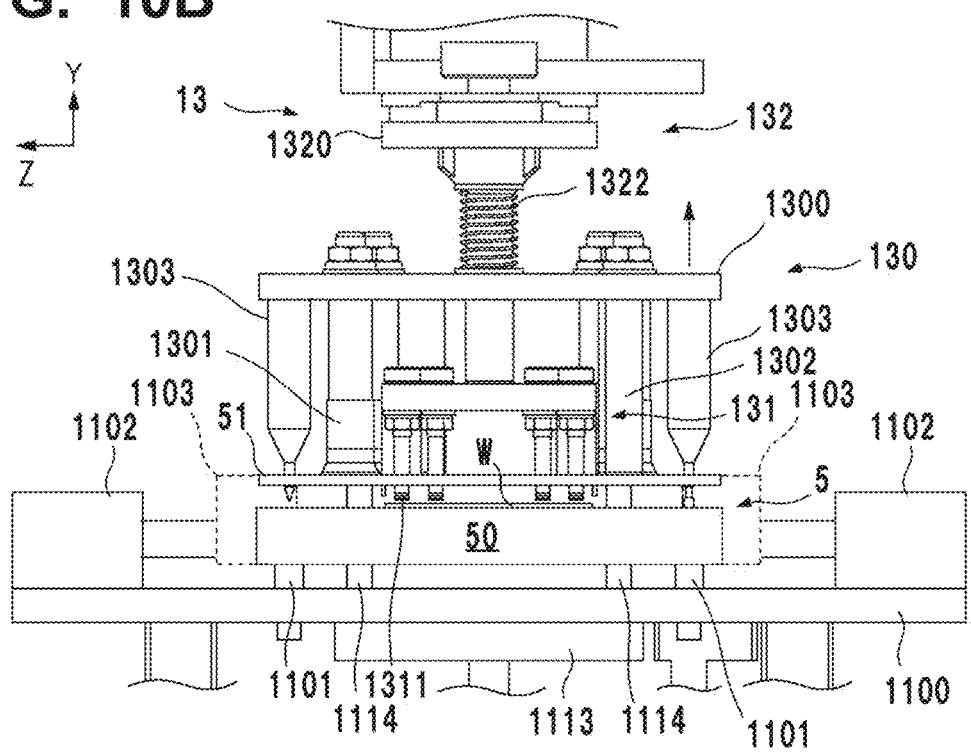

Then, as shown in FIG. 10A, the driving unit 1110 of the separation unit 111 is driven to move up the pin support table 1113. As shown in FIG. 10B, the pins 1114 project from the placing portion 50 to push up the cover 51 and separate the cover 51 upward from the placing portion 50. That is, the coupling between the placing portion 50 and the cover 51 is canceled, and the cover 51 is located at a position spaced apart from the placing portion 50 by a predetermined distance. The cover holding unit 130 is supported by the support portions 1322 to be displaceable with respect to the support unit 132.

Thus, when the cover 51 is pushed up, the cover holding unit 130 also moves up together with the cover 51.

Thereafter, suction of the chucking portions 1311 of the substrate holding unit 131 starts. Since the opening 51b is formed in the cover 51, a portion of the substrate W that does not overlap the cover 51 is chucked and held by the chucking portions 1311 via the opening 51b. At this time, the substrate regulating members 1312 regulate the position of the substrate W. The cover holding unit 130 chucks and holds the cover 51, and the substrate holding unit 131 chucks and holds the substrate W. In this embodiment, chucking of the substrate W starts after canceling the coupling between the cover 51 and the placing portion 50. However, chucking of the substrate W may start before canceling the coupling between the cover 51 and the placing portion 50.

Figure 11A:
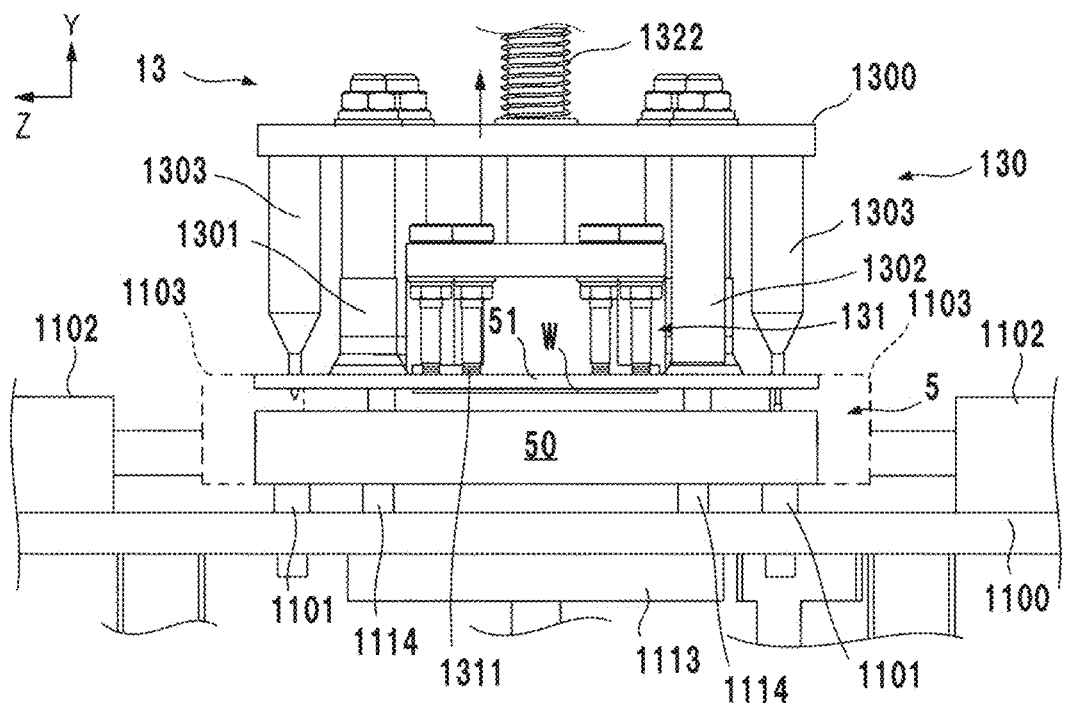
FIGS. 11A and 11B are views for explaining the operation of the transfer system in FIG. 1.

Subsequently, as shown in FIG. 11A, the moving apparatus 14 moves up the holding apparatus 13. At this time, the placing portion 50 stays on the carrier processing apparatus 11, and the cover 51 and the substrate W move up together with the holding apparatus 13. Both the cover 51 and the substrate W are held parallel to each other in the horizontal posture.

By pushing up the cover 51 by the pins 1114, the cover holding unit 130 that has been displaced upward with respect to the support unit 132 returns (moves down) to the original position by this displacement.

Figure 11B:
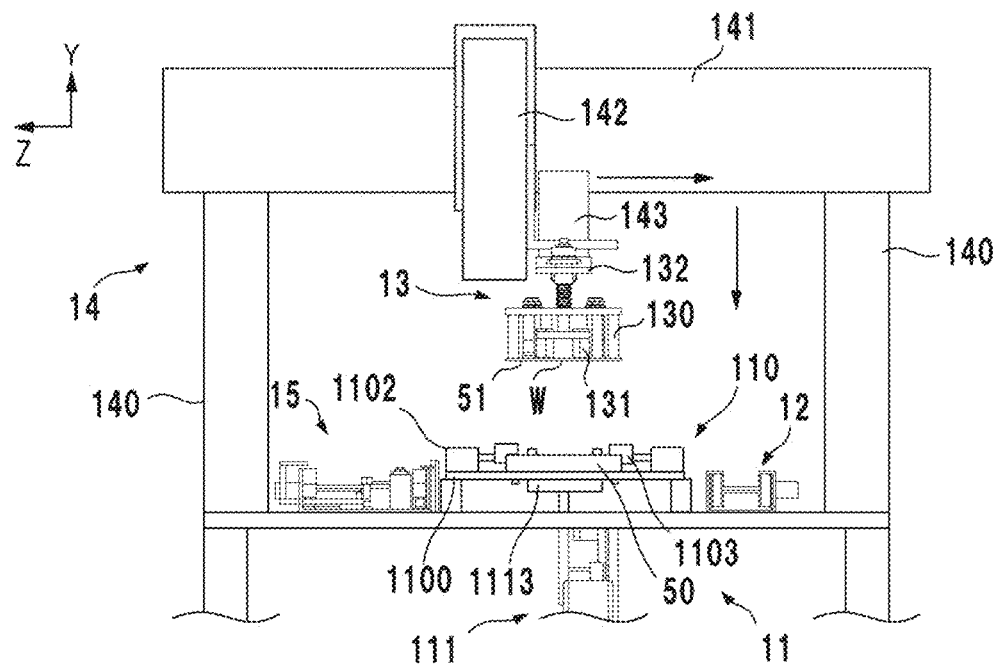
Figure 12:
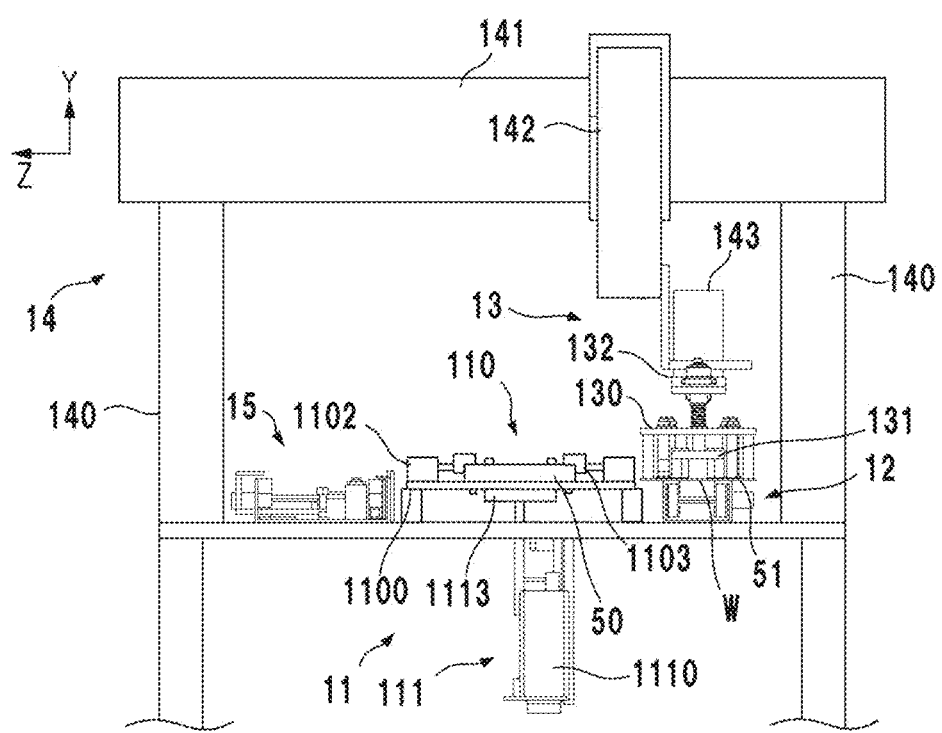
FIG. 12 is a view for explaining the operation of the transfer system in FIG. 1.

Then, as shown in FIG. 11B, the moving apparatus 14 moves, to above the transport apparatus 12, the holding apparatus 13 holding the cover 51 and the substrate W. The pivot unit 143 adjusts the rotation angle of the holding apparatus 13 on the horizontal plane. As shown in FIG. 12, the holding apparatus 13 is moved down onto the transport apparatus 12.

Figure 13A:
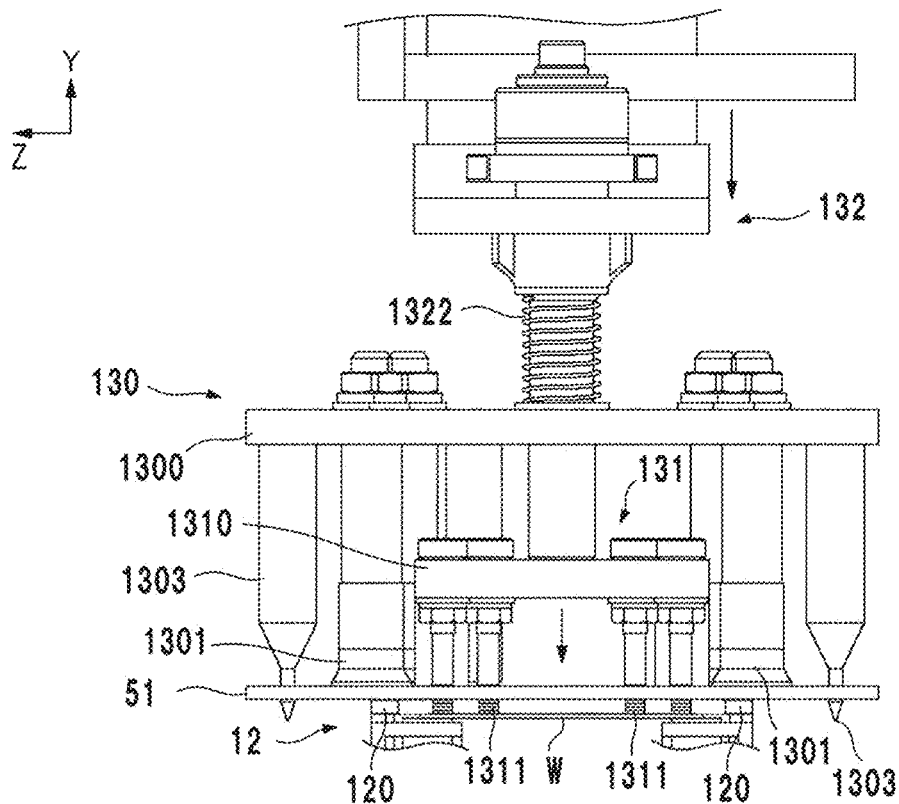
FIGS. 13A and 13B are views for explaining the operation of the transfer system in FIG. 1.

At upper portions of the transport apparatus 12, projections 120 are formed at positions where they do not interfere with the substrate W, as shown in FIG. 13A. When the holding apparatus 13 is moved down onto the transport apparatus 12, the projections 120 abut against the cover 51 and stop the down movement of the cover 51 prior to the substrate W. More specifically, when the projections 120 abut against the lower surface of the cover 51, the cover holding unit 130 cannot move down anymore. The support portions 1322 support the cover holding unit 130 so that the cover holding unit 130 can be displaced with respect to the support unit 132. Hence, if the down movement of the holding apparatus 13 continues, the substrate holding unit 131 moves down to be lower than the cover holding unit 130, and the substrate W moves apart from the cover 51.

The down movement of the holding apparatus 13 is stopped at a predetermined position, and the suction of the chucking portions 1311 is stopped to release the substrate W to the atmospheric pressure. Thus, the chucking of the substrate W is canceled and the substrate W is placed on the transport apparatus 12. By these operations, the transfer of the substrate W to the transport apparatus 12 is completed.

Figure 13B:
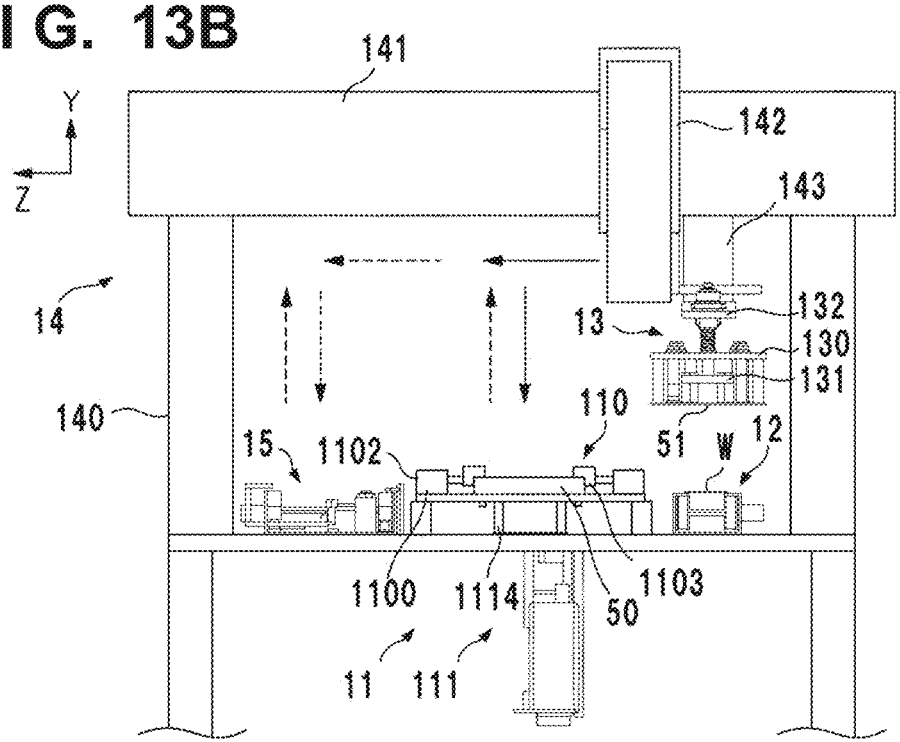

After that, an operation of superposing the cover 51 on the placing portion 50 on the positioning unit 110 at the transfer source to empty the carrier 5, and transferring the empty carrier 5 to the transport apparatus 10 is performed. First, as shown in FIG. 13B, the holding apparatus 13 holding only the cover 51 is moved above the carrier processing apparatus 11. The pivot unit 143 adjusts the rotation angle of the holding apparatus 13 on the horizontal plane. The holding apparatus 13 is moved to the placing portion 50 at the transfer source, and the cover 51 and the placing portion 50 are coupled. Note that the pin support table 1113 performs an operation opposite to the separation operation to move the pins 1114 to the retreat positions.

By superposing the cover 51 on the placing portion 50, they are coupled by magnetic force. The carrier 5 therefore becomes empty without holding the substrate W. The actuators 1102 are driven to move the positioning members 1103 apart from the placing portion 50, thereby canceling the holding of the placing portion 50.

The moving apparatus 14 moves the holding apparatus 13 holding the empty carrier 5 onto the transport apparatus 10. The pivot unit 143 adjusts the rotation angle of the holding apparatus 13 on the horizontal plane. Subsequently, the suction of the chucking portions 1301 of the cover holding unit 130 is stopped to release the carrier 5 to the atmospheric pressure. The holding of the empty carrier 5 is thus canceled, and the empty carrier 5 is transferred to the transport apparatus 10. The transport apparatus 10 unloads the empty carrier 5 to the storage apparatus 2, and the new carrier 5 holding the substrate W is loaded from the processing apparatus 3 into the transport apparatus 10.

The substrate W placed on the transport apparatus 12 is transferred to the processing apparatus 4 by the transport apparatus 12 and is processed by the processing apparatus 4.

As described above, according to this embodiment, when transferring the substrate W from the carrier processing apparatus 11 to the transport apparatus 12, the holding apparatus 13 holds and transports both the cover 51 and the substrate W. Compared to a method of separately moving the cover 51 and the substrate W, the number of transfer steps can be decreased to improve the transfer efficiency of the substrate W. The cover 51 and the substrate W are held adjacently with their surfaces being in postures parallel to each other. The cover 51 and the substrate W are moved while keeping this positional relationship on the carrier 5. Switching of holding of the cover 51, and the like become unnecessary, and the efficiency when returning the cover 51 onto the placing portion 50 can also be improved, in addition to the improvement of the transfer efficiency of the substrate W.

Second Embodiment

In the first embodiment, the substrate W is chucked in contact and held by negative-pressure suction by the chucking portions 1311 of the substrate holding unit 131. Instead, non-contact chucking by the Bernoulli chuck method is also possible.

Figure 14:
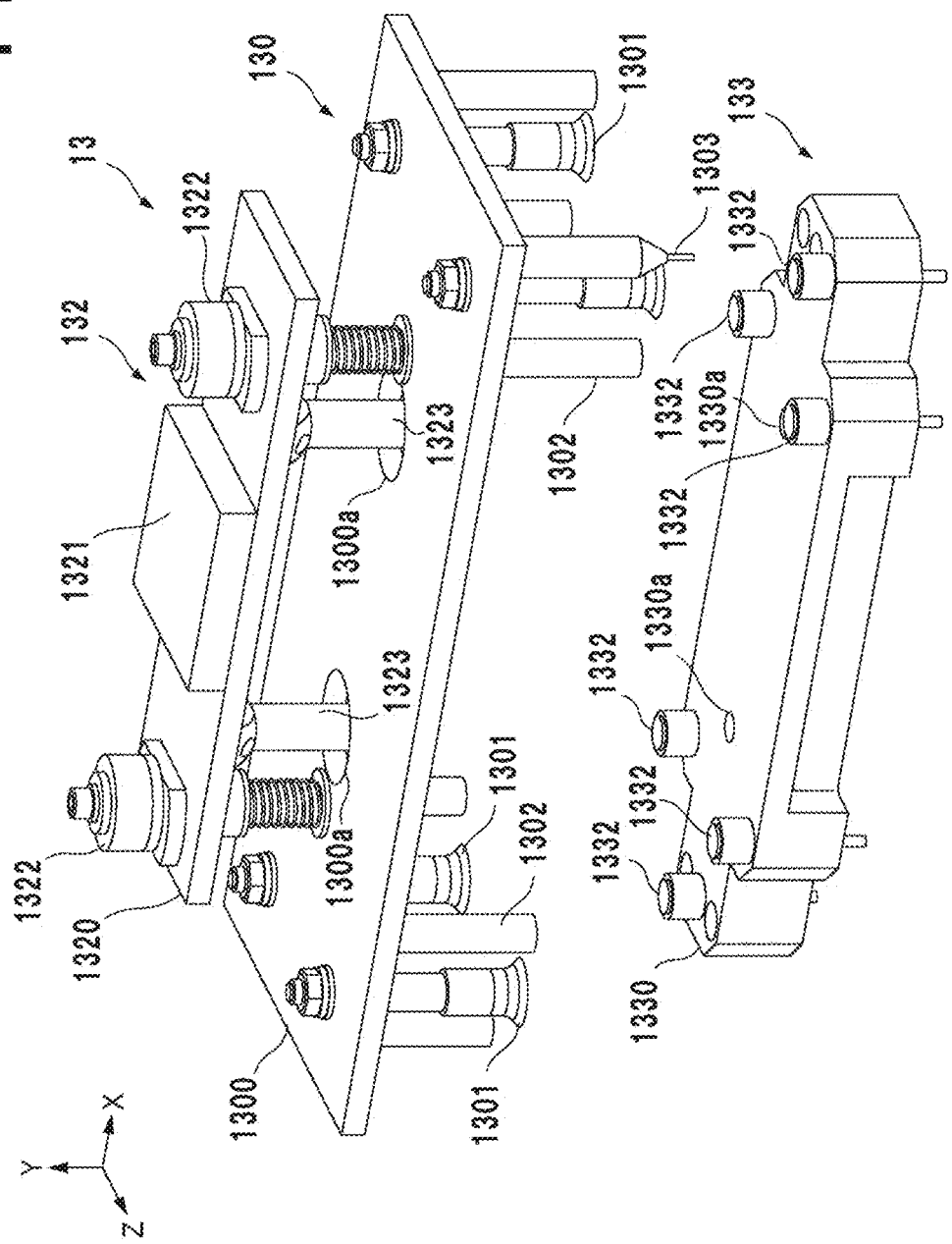
FIG. 14 is a schematic view showing a holding apparatus of another example.
Figure 15A:
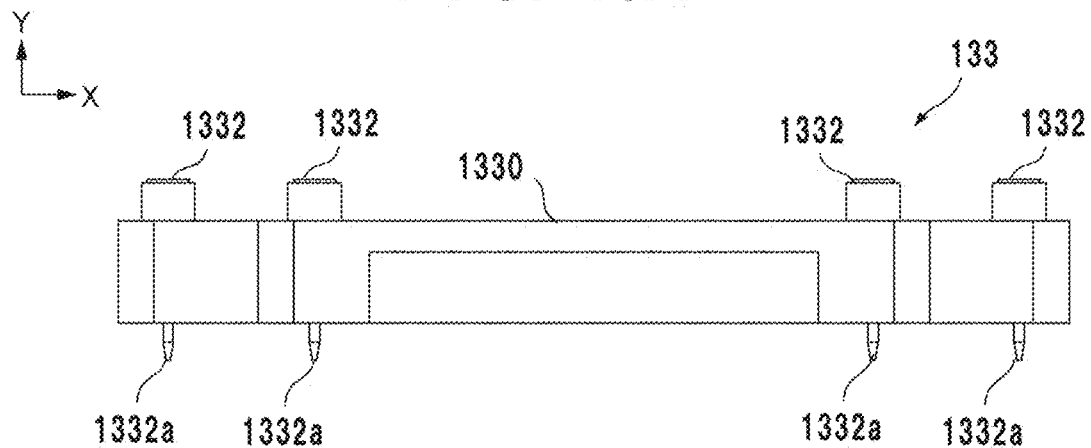
FIGS. 15A and 15B are schematic views showing the substrate holding unit of the holding apparatus of the other example.
Figure 15B:
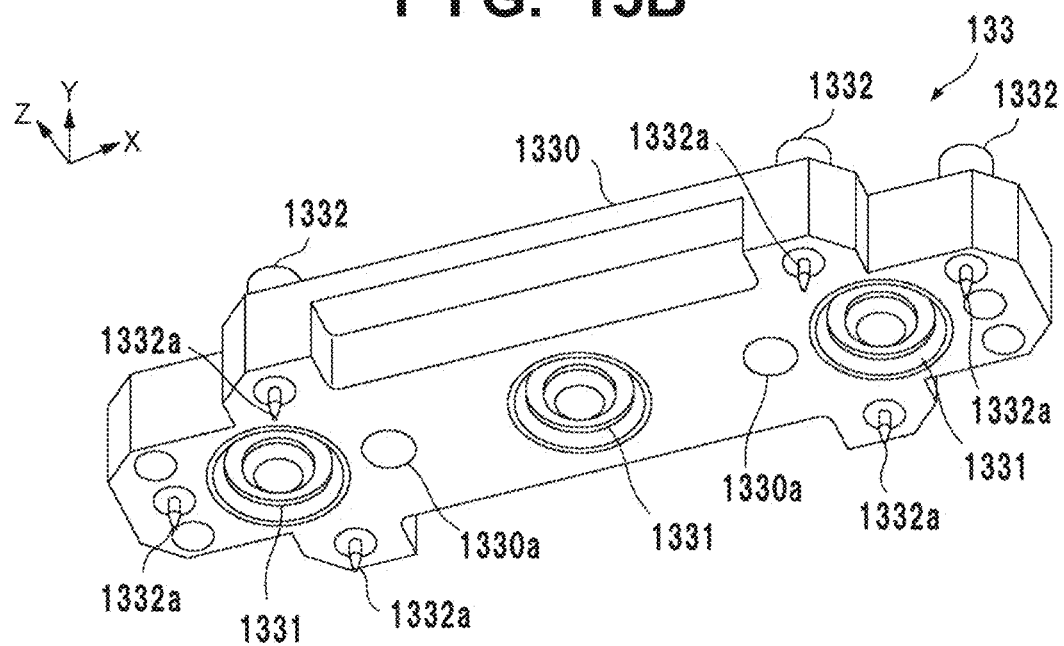

FIG. 14 is a partial exploded view showing a holding apparatus 13 according to this embodiment. FIGS. 15A and 15B are schematic views showing a substrate holding unit 133. The holding apparatus 13 includes a cover holding unit 130, the substrate holding unit 133, and a support unit 132 that supports them. The arrangements of the cover holding unit 130 and support unit 132 are the same as those in the first embodiment.

The substrate holding unit 133 is a unit that holds a substrate W to freely cancel holding. The substrate holding unit 133 includes a base member 1330, chucking portions 1331, and regulating units 1332. Attaching holes 1330a (two attaching holes 1330a are illustrated in this embodiment) in which support portions 1323 of the support unit 132 are fixed are formed in the base member 1330. The base member 1330 is formed to avoid interference with positioning members 1103 of a positioning unit 110.

Each chucking portion 1331 is arranged in a recessed portion of the lower surface of the base member 1330. In this embodiment, three chucking portions are arranged at an interval in the longitudinal direction of the substrate. The chucking portion 1331 is connected to a fluid generation source (not shown) via a path formed inside the base member 1330, and is configured to eject air. The air ejected from the chucking portions 1331 flows outside circumferentially from a gap between the lower surface of the base member 1330 and the substrate W. The air pressure at the gap between the chucking portions 1331 and the substrate W becomes lower than the atmospheric pressure, thereby chucking the substrate W in the non-contact manner.

Chucking of the substrate W is non-contact chucking, and the substrate W is freely movable in the substrate surface direction. Thus, the plurality of regulating units 1332 that regulate free movement of the substrate W in the substrate surface direction (horizontal direction in this embodiment) are arranged around each chucking portion 1331 provided at each end portion of the base member 1330 in the longitudinal direction. Each regulating unit 1332 includes a pin-like regulating portion 1332a projecting from the lower surface of the base member 1330. The regulating portion 1332a is arranged to be able to project/retract from/to the main body of the regulating unit 1332. The regulating portion 1332a projects from the lower surface of the base member 1330 in the Y direction to freely extend/contract.

The plurality of regulating units 1332 are arranged at an interval so that the regulating portions 1332a surround the edge of the substrate W. In this embodiment, six regulating units 1332 are arranged. More specifically, two regulating units 1332 on each of facing sides of the substrate W in the longitudinal direction, that is, a total of four regulating units 1332, and one regulating unit 1332 on each of facing sides of the substrate W in the widthwise direction, that is, a total of two regulating units 1332 are arranged. When the substrate W moves in the substrate surface direction, the edge of the substrate W abuts against the respective regulating portions 1332a, and the free movement of the substrate W is regulated.

The operation of the substrate holding unit 133 during the transfer operation of the substrate W in this embodiment will be explained with reference to FIGS. 16A to 18.

Figure 16A:
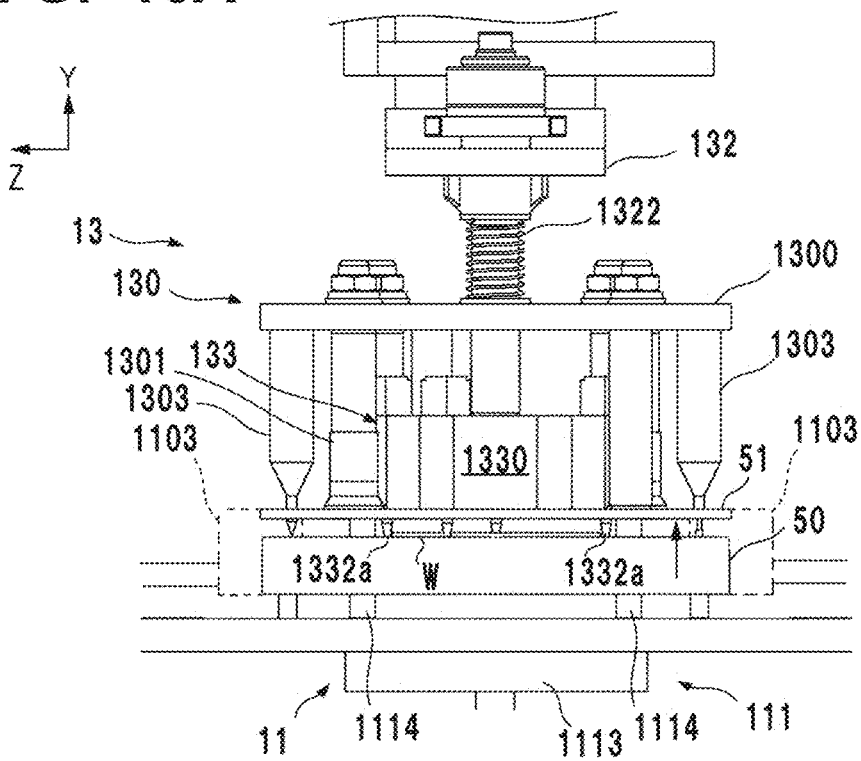
FIGS. 16A and 16B are views for explaining the operation of the holding apparatus of the other example.

FIG. 16A shows a state in which pins 1114 push up a cover 51. This state is equivalent to the stage of FIG. 10A in the first embodiment. The regulating portions 1332a of the substrate holding unit 133 abut against the upper surface of a placing portion 50, and the six regulating portions 1332a surround the substrate W. The substrate W and the cover 51 are spaced apart from each other. The regulating portions 1332a freely extend/contract. Hence, when the holding apparatus 13 is moved down onto the positioning unit 110, the regulating portions 1332a abut against the upper surface of the placing portion 50. When the holding apparatus 13 is further moved down, the regulating portions 1332a contract.

Figure 16B:
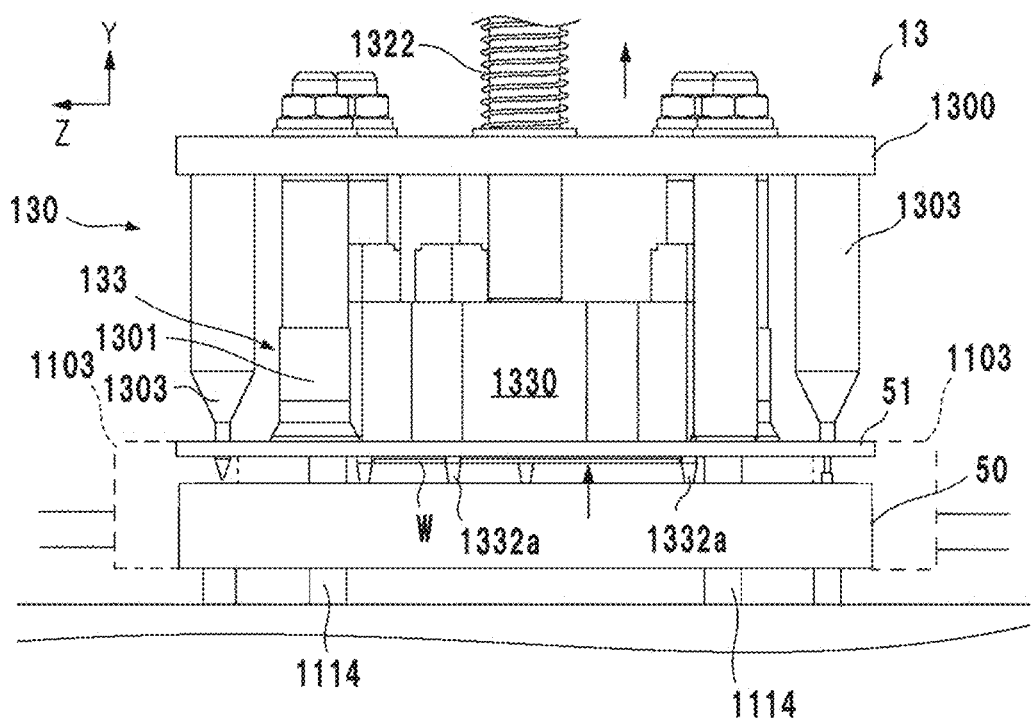

When ejection of air from the chucking portions 1331 starts, the substrate W is spaced apart from the placing portion 50, as shown in FIG. 16B, and is chucked to the lower surface of the base member 1330 in the non-contact manner. While regulating the periphery of the substrate W at the time of chucking in the non-contact manner, the regulating portions 1332a guide movement of the substrate W from the placing portion 50 to a non-contact chucking/holding position. Note that the cover 51 and the substrate W are held by the holding apparatus 13 in a state in which their facing surfaces contact each other at an overlapping portion. Subsequently, the moving apparatus 14 moves up the holding apparatus 13. Both the cover 51 and the substrate W are held parallel to each other in the horizontal posture.

Figure 17A:
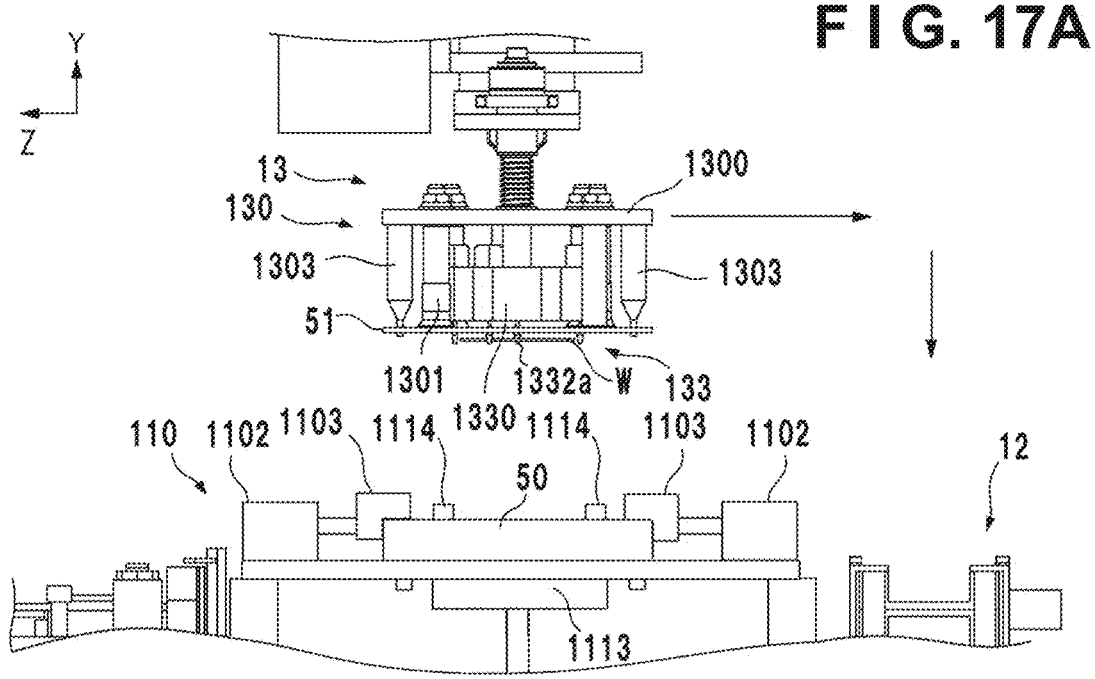
FIGS. 17A and 17B are views for explaining the operation of the holding apparatus of the other example.

Then, as shown in FIG. 17A, the moving apparatus 14 moves down the holding apparatus 13 onto the transport apparatus 12. At the time of movement, the substrate W may freely move in the substrate surface direction (Z direction). However, the regulating portions 1332a regulate this free movement.

Figure 17B:
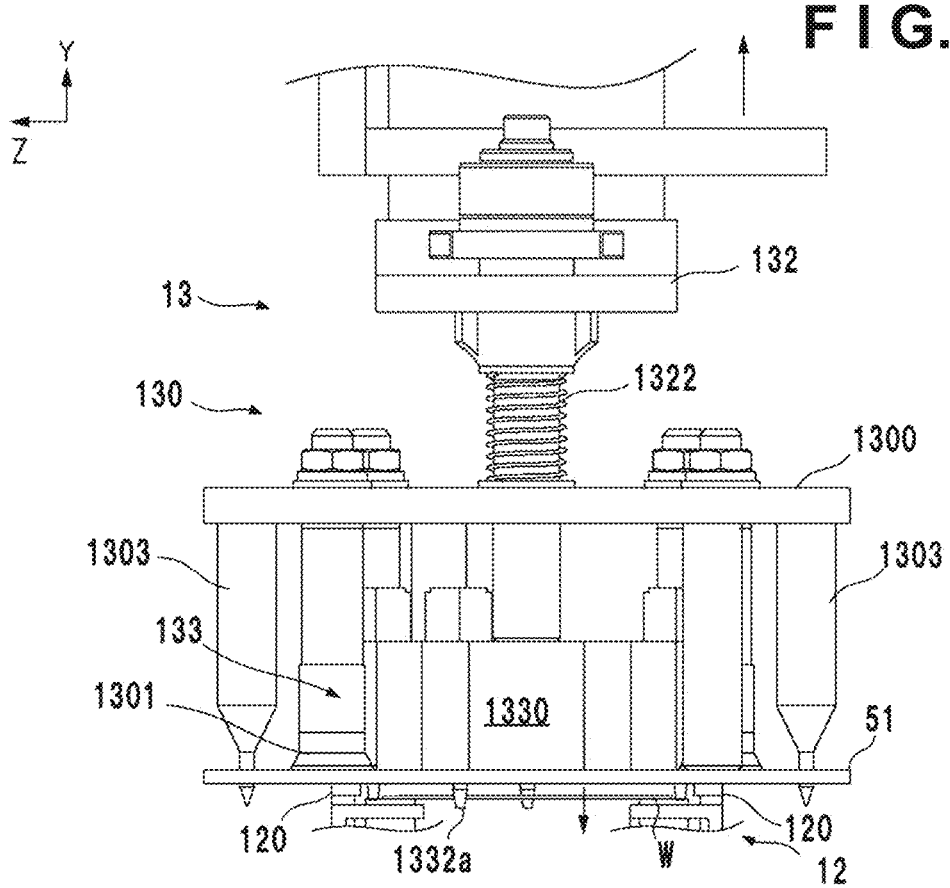

As in the first embodiment, when the holding apparatus 13 is moved down onto the transport apparatus 12, the projections 120 abut against the cover 51 and become a state in FIG. 17B. When the ejection of air from the chucking portions 1331 is stopped, the chucking of the substrate W is canceled, and the substrate W is placed on the transport apparatus 12. Even at this time, the regulating portions 1332a guide the movement of the substrate W until the substrate W is placed on the transport apparatus 12 while regulating the periphery of the substrate W. By these operations, the transfer of the substrate W to the transport apparatus 12 is completed.

Figure 18:
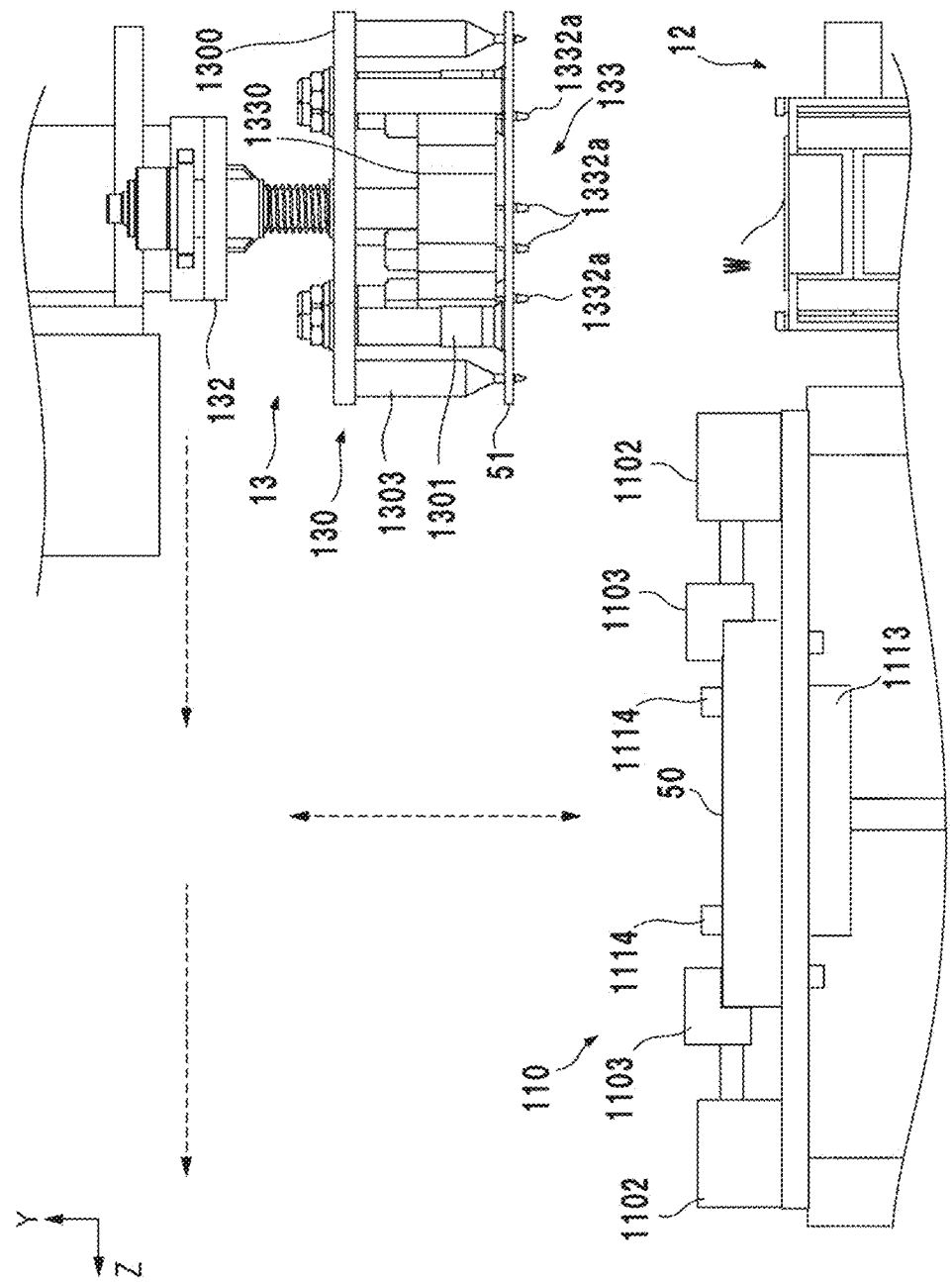
FIG. 18 is a view for explaining the operation of the holding apparatus of the other example.

After that, an operation of superposing the cover 51 on the placing portion 50 on the positioning unit 110 at the transfer source to empty the carrier 5, and transferring the empty carrier 5 to a transport apparatus 10 is performed, as shown in FIG. 18.

In this embodiment, the substrate W is held without contacting the substrate holding unit 133, so it can be prevented to leave a chucking trace on the substrate W.

In a transfer system 1 according to this embodiment, the transport apparatus 10 and a carrier processing apparatus 11 are arranged at positions different in the Z direction. Alternatively, the carrier processing apparatus 11 may be arranged midway along the transport locus by the transport apparatus 10 so that the transport apparatus 10 and the carrier processing apparatus 11 are arranged at the same position in the Z direction. This makes it possible to continuously perform loading/unloading of the carrier 5, separation between the placing portion 50 and the cover 51, and holding of the substrate W and cover 51.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-003675, filed Jan. 10, 2014, which is hereby incorporated by reference herein in its entirety.

What is claimed is:

1. A holding apparatus that holds, from a carrier including a placing portion on which a substrate is placed, and a cover that is superposed on an upper surface of the placing portion in close contact, the substrate held between the placing portion and the cover, and the cover, comprising:
   a cover holding unit configured to hold the cover;
   a substrate holding unit configured to hold the substrate; and
   a support unit configured to support said cover holding unit and said substrate holding unit,
   wherein said support unit supports said cover holding unit to be able to displace said cover holding unit in directions in which said cover holding unit moves close to and apart from the carrier.

2. The apparatus according to claim 1, wherein said support unit includes a floating mechanism configured to floatingly support said cover holding unit in the directions in which said cover holding unit moves close to and apart from the carrier.

3. The apparatus according to claim 1, wherein said cover holding unit includes:
   a chucking portion configured to chuck the cover; and
   a cover regulating member configured to abut against the cover and regulate a position of the cover in a chucking direction.

4. The apparatus according to claim 1, wherein said cover holding unit includes:
   a chucking portion configured to chuck the cover; and
   a positioning member configured to engage with the placing portion and position said cover holding unit with respect to the carrier.

5. The apparatus according to claim 1, wherein said substrate holding unit includes:
   a chucking portion configured to chuck the substrate in a non-contact manner; and
   a regulating unit configured to regulate free movement of the substrate chucked in the non-contact manner in a substrate surface direction.

6. The apparatus according to claim 5, wherein
   said support unit includes a support portion configured to support said substrate holding unit, and
   said regulating unit includes a regulating portion configured to project to freely extend/contract in a direction perpendicular to the substrate surface direction.

7. A transfer system that transfers, from a carrier including a placing portion on which a substrate is placed, and a cover that is superposed on an upper surface of the placing portion in close contact, the substrate held between the placing portion and the cover, comprising:
   a positioning unit configured to position and hold the placing portion of the carrier;
   a separation unit configured to separate the cover from the placing portion of the carrier held by said positioning unit;
   a holding apparatus defined in claim 1; and
   a moving apparatus configured to move said holding apparatus.

8. The system according to claim 7, wherein
   said separation unit includes an abutment member configured to freely move up and down between a retreat position at which the abutment member is positioned below the placing portion of the carrier positioned by said positioning unit, and a working position at which the abutment member projects from the upper surface of the placing portion, and configured to abut against a lower surface of the cover of the carrier, and
   said positioning unit includes a base member having an opening through which the abutment member can pass.

9. The system according to claim 7, wherein
   the transfer system further comprises:
   a base portion on which said moving apparatus and said positioning unit are arranged; and
   a transport apparatus arranged on said base portion and configured to transport the substrate, and
   said moving apparatus supports said holding apparatus movably at least between said positioning unit and said transport apparatus.

10. The system according to claim 9, wherein said moving apparatus includes:
   a guide unit extending in a horizontal direction above said transport apparatus and said positioning unit;
   a column supporting said guide unit;
   a horizontally moving member configured to be movable along said guide unit; and
   an elevating unit arranged on said horizontally moving member and configured to move up and down said holding apparatus.

* * * * *